United States Patent [19]

Matsugu et al.

[11] Patent Number: 5,114,236

[45] Date of Patent: May 19, 1992

[54] POSITION DETECTION METHOD AND APPARATUS

[75] Inventors: Masakazu Matsugu, Atsugi; Kenji Saitoh; Mitsutoshi Ohwada, both of Yokohama, all of Japan

[73] Assignee: Canon Kabushiki Kaisha, Tokyo, Japan

[21] Appl. No.: 562,656

[22] Filed: Aug. 3, 1990

[30] Foreign Application Priority Data

Aug. 4, 1989 [JP] Japan .................. 1-203053
May 25, 1990 [JP] Japan .................. 2-136827

[51] Int. Cl.$^5$ .................................................. G01B 9/02
[52] U.S. Cl. .................................. 356/401; 356/400; 250/548
[58] Field of Search .................. 356/400, 401; 250/491.1, 237.6, 548

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 350/401 |
| 4,355,892 | 10/1982 | Mayer et al. | 355/77 |
| 4,398,824 | 8/1983 | Feldman et al. | 356/401 |
| 4,514,858 | 4/1985 | Novak | 378/34 |
| 4,614,432 | 9/1986 | Kuniyoshi et al. | 356/401 |
| 4,690,529 | 9/1987 | Sugiyama et al. | 353/122 |
| 4,748,333 | 5/1988 | Miztani et al. | 250/561 |
| 4,814,829 | 3/1989 | Kosugi et al. | 355/53 |
| 4,857,744 | 8/1989 | Kataoka et al. | 356/401 |
| 4,952,970 | 8/1990 | Suzuki et al. | 355/43 |

FOREIGN PATENT DOCUMENTS

| | | |
|---|---|---|
| 0302178 | 2/1989 | European Pat. Off. |
| 0323242 | 7/1989 | European Pat. Off. |
| 2598797 | 11/1987 | France |
| 157033 | 12/1981 | Japan |

OTHER PUBLICATIONS

Feldman, et al., "Application of Zone Plates to Alignment in X-ray Lithography," Optical Engineering, vol. 22, No. 2 Mar.-Apr. 1983, pp. 203 through 207.

Primary Examiner—Samuel A. Turner
Assistant Examiner—Richard E. Kurtz, II
Attorney, Agent, or Firm—Fitzpatrick, Cella, Harper & Scinto

[57] ABSTRACT

A position detecting method for detecting the position of a substrate by use of a grating pattern provided on the substrate includes irradiating the grating pattern with first and second radiation beams having different wavelengths to produce first and second diffraction beams of different wavelengths; and receiving the first and second diffraction beams by use of a sensor to determine the position of the substrate on the basis of the position of incidence of each of the first and second diffraction beams on the sensor.

52 Claims, 15 Drawing Sheets

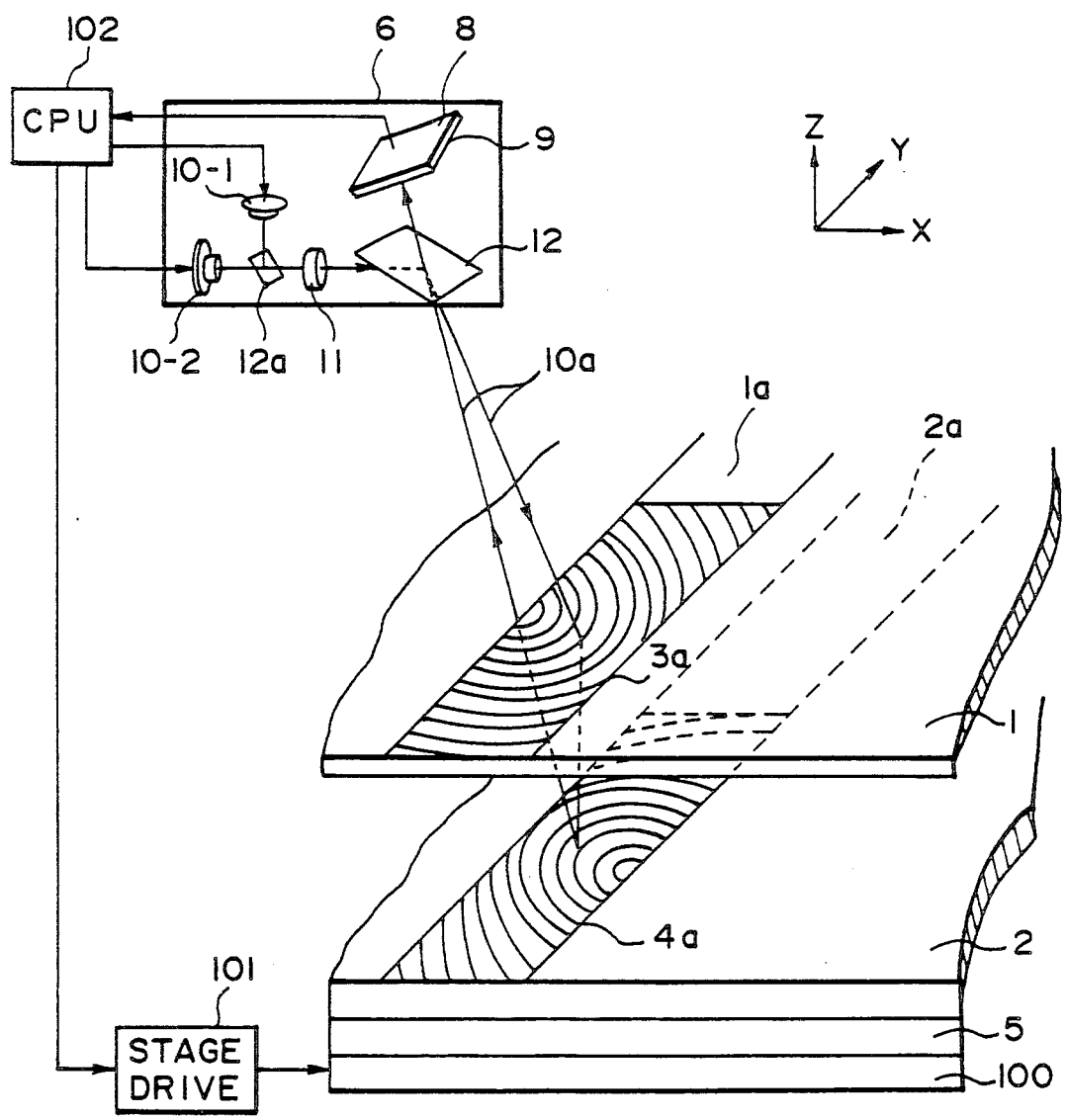
F I G. 10

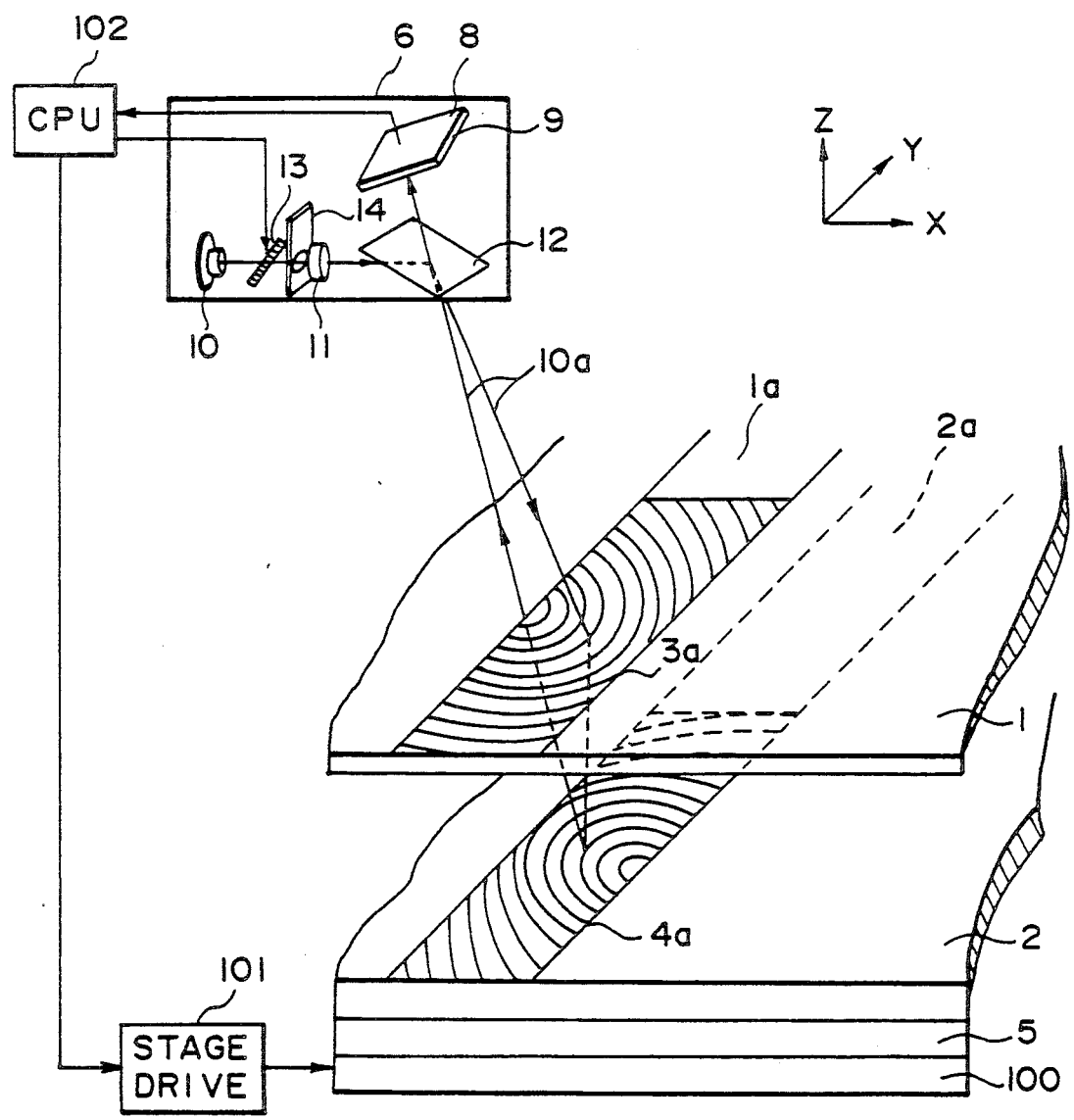
F I G. 11

POSITION DETECTION METHOD AND APPARATUS

FIELD OF THE INVENTION AND RELATED ART

This invention relates generally to a position detecting method and apparatus. More particularly, the invention is concerned with position detecting method and apparatus suitably usable in a semiconductor microcircuit device manufacturing exposure apparatus for relatively positioning or aligning a first object (original) such as a mask or reticle (hereinafter simply "mask") and a second object (workpiece) such as a wafer.

In exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to reflectively diffract the received light to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

The inventors of the subject application have found a specific problem peculiar to this alignment method. Namely, in this method, if a wafer surface is inclined with respect to a mask surface, a certain reference surface such as the surface of a mask holder in a semiconductor device manufacturing exposure apparatus, or a ground surface on which the exposure apparatus is placed, there occurs a shift of the position of light incident upon a sensor. Such a shift results in an alignment error.

FIG. 3 shows such a shift of the position of the center of gravity of light upon a detecting surface 82' in the case where a wafer 60 is inclined by an angle $\theta$. Assuming now that an alignment light passing through a mask is incident on the wafer 60 in the manner as shown in FIG. 3, and if there is an average surface inclination of an angle $\theta$ at the location of a wafer alignment mark 60a, then the position of the center of gravity of light spot on the detecting surface 82' is at a point $P\theta$ which is displaced by an amount $\Delta\delta\theta$ from the point Po of spot of focused light to be defined where no inclination occurs. This can be expressed by an equation:

$$\Delta\delta\theta = bw \cdot \tan 2\theta$$

Assuming now that $$\theta \div 10^{-4} (\text{rad}) \tag{i}$$

(a change of 100 A per a size 100 microns of a mark)

$$bw = 18.7 \text{ mm}, \tag{ii}$$

then, $$\Delta\delta\theta = 18.7 \times 10^{+3} \times 2 \times 10^{-4} = 3.74 \text{ (micron)}$$

Namely, there occurs an alignment error of 3.74 microns, and this means that the mask and the wafer can not be aligned with a precision higher than that value.

SUMMARY OF THE INVENTION

It is accordingly an object of the present invention to provide a position detecting method and apparatus by which the position of a substrate such as a mask or wafer can be detected correctly without being influenced by the overall or local inclination of the surface of the substrate.

In accordance with a first aspect of the present invention, to achieve the above object, there is provided a position detecting method for detecting the position of a substrate by use of a grating pattern provided on the substrate, the method comprising the steps of: irradiating the grating pattern with first and second radiation beams having different wavelengths to produce first and second diffraction beams of different wavelengths; and receiving the first and second diffraction beams by use of a sensor to determine the position of the substrate on the basis of the position of incidence of each of the first and second diffraction beams on the sensor.

In this first aspect, the position of the substrate with respect to a direction substantially perpendicular to the surface of the substrate or, alternatively, with respect to a direction substantially parallel to the surface of the substrate, can be detected. The grating pattern may have an optical power or, alternatively, it may have no optical power. A representative example of the grating pattern with an optical power is a Fresnel zone plate. An example of the grating pattern without optical power is a rectilinear grating pattern.

In accordance with a second aspect of the present invention, there is provided a method of detecting the relative position of first and second substrates by use of a first mark with an optical power, provided on the first substrate and having wavelength dependence, and a second mark with an optical power, provided on the second substrate and having wavelength dependence, the method comprising the steps of: projecting first and second radiation beams having different wavelengths through the first mark to the second mark; and receiving the first and second radiation beams from the second mark by use of a sensor to determine the relative position of the first and second substrates on the basis of the position of incidence of each of the first and second radiation beams on the sensor.

In the second aspect, the first mark may have a positive power and the second mark may have a negative power. Alternatively, the first mark may have a negative power and the second mark may have a positive power. As a further alternative, each of the first and second marks may have a positive power. Each of the first and second marks may be provided by a lens-like element or a grating pattern such as a Fresnel zone plate.

In accordance with a third aspect of the present invention, there is provided a method of detecting the relative position of first and second substrates in a direction substantially perpendicular to the surface of the first or second substrate, by use of a grating pattern provided on the first substrate, the method comprising the steps of: irradiating the grating pattern with first and second radiation beams having different wavelengths to produce first and second diffraction beams of different wavelengths so that the first and second diffraction beams are projected onto the second substrate obliquely; and receiving the first and second diffraction beams reflected from the second substrate by use of a sensor to determine the relative position of the first and second substrates on the basis of the position of incidence of each of the first and second diffraction beams on the sensor.

In the third aspect, preferably an auxiliary grating pattern, separate from the grating pattern, may be provided on the first substrate. The first and second diffraction beams reflected by the second substrate may be inputted to and diffracted again by the auxiliary grating pattern and, after this, they are directed to the sensor. The auxiliary grating pattern may preferably be provided by a pattern with an optical power, such as a Fresnel zone plate.

Alternatively, a grating pattern may be provided on the second substrate and the first and second diffraction beams may be directed to the diffraction pattern of the second substrate, whereby the first and second diffraction beams are produced.

In accordance with a fourth aspect of the present invention, there is provided a method of detecting the relative position of first and second substrates in a direction substantially perpendicular to the surface of the first or second substrate, by use of a pattern with an optical power, provided on the first substrate and having wavelength dependence, the method comprising the steps of: projecting first and second radiation beams having different wavelengths obliquely to the second substrate; and receiving, through the pattern and by use of a sensor, the first and second radiation beams reflected by the second substrate to determine the relative position of the first and second substrates on the basis of the position of incidence of each of the first and second diffraction beams on the sensor.

In the fourth aspect, the pattern may be provided by a grating pattern such as a Fresnel zone plate or a lens-like element.

In the above-described aspects, the first and second radiation beams may be projected in sequence or at the same time. On the other hand, the first and second radiation beams or the first and second diffraction beams may be received by the sensor in sequence or at the same time. Where they are to be received at the same time, preferably first and second, different sensors may be used to receive the first and second radiation beams or the first and second diffraction beams, respectively.

The position of incidence of each of the first and second radiation beams or the first and second diffraction beams, upon the sensor, may be determined on the basis of the position of the gravity center of an intensity distribution upon the light receiving surface of the sensor or, alternatively, it may be determined on the basis of the position of a peak in the intensity distribution on the light receiving surface of the sensor.

The sensor may comprise a one-dimensional or two-dimensional CCD (charge coupled device) array or a PSD (position sensitive detector). Where a PSD is used, since it can produce a signal representing the position of the gravity center of the intensity distribution of a light beam inputted thereto, the position of incidence of the radiation beam or the diffraction beam may be determined by the position of the center of gravity. On the other hand, where a CCD array is used, since it can produce a signal corresponding to the intensity distribution of a received light beam, it is necessary to determine beforehand whether the determination of the position of incidence of the radiation beam or diffraction beam should be made on the basis of the position of the center of gravity or the peak position. In any case, the output signal of the CCD array may be inputted to and processed in a controller, for determination of the position of incidence of the radiation beam or diffraction beam.

For projection of the first and second radiation beams having different wavelengths, use may be made of a light source such as a semiconductor laser, whose emission wavelength is variably adjustable; a combination of a light source for emitting multi-color light with a wavelength selecting element; a combination of plural light sources for emitting lights of different wavelengths, respectively; or the like. As for the wavelength selecting element, a movable diffraction grating, a movable prism, a movable etalon, a color filter assembly or the like may be used.

For sequential reception of the beams of different wavelengths by the sensor, a wavelength selecting element such as described above may be provided between the substrate and the sensor such that, through this wavelength selecting element, the beams of different wavelengths may be directed to the sensor in sequence.

For simultaneous reception of the beams of different wavelengths by the sensor, preferably a plurality of sensors may be used to allow that these sensors receive the beams of different wavelengths, respectively. In that case, for distribution of the beams of different wavelengths to corresponding sensors, a dichroic mirror or an assembly including it may be used.

The position detecting method of the present invention or an arrangement using the same, can be suitably used in an exposure apparatus for manufacture of semiconductor microcircuit devices. Since in such exposure apparatus it is necessary to detect the relative position of a mask and a wafer for relative alignment of them or for adjustment of the interval between them, the present invention can be effectively applicable to such exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 10-12 are schematic representations, respectively, illustrating alignment systems according to second, third and fourth embodiments of the present invention, respectively.

DESCRIPTION OF THE PREFERRED EMBODIMENTS

Figure 4:
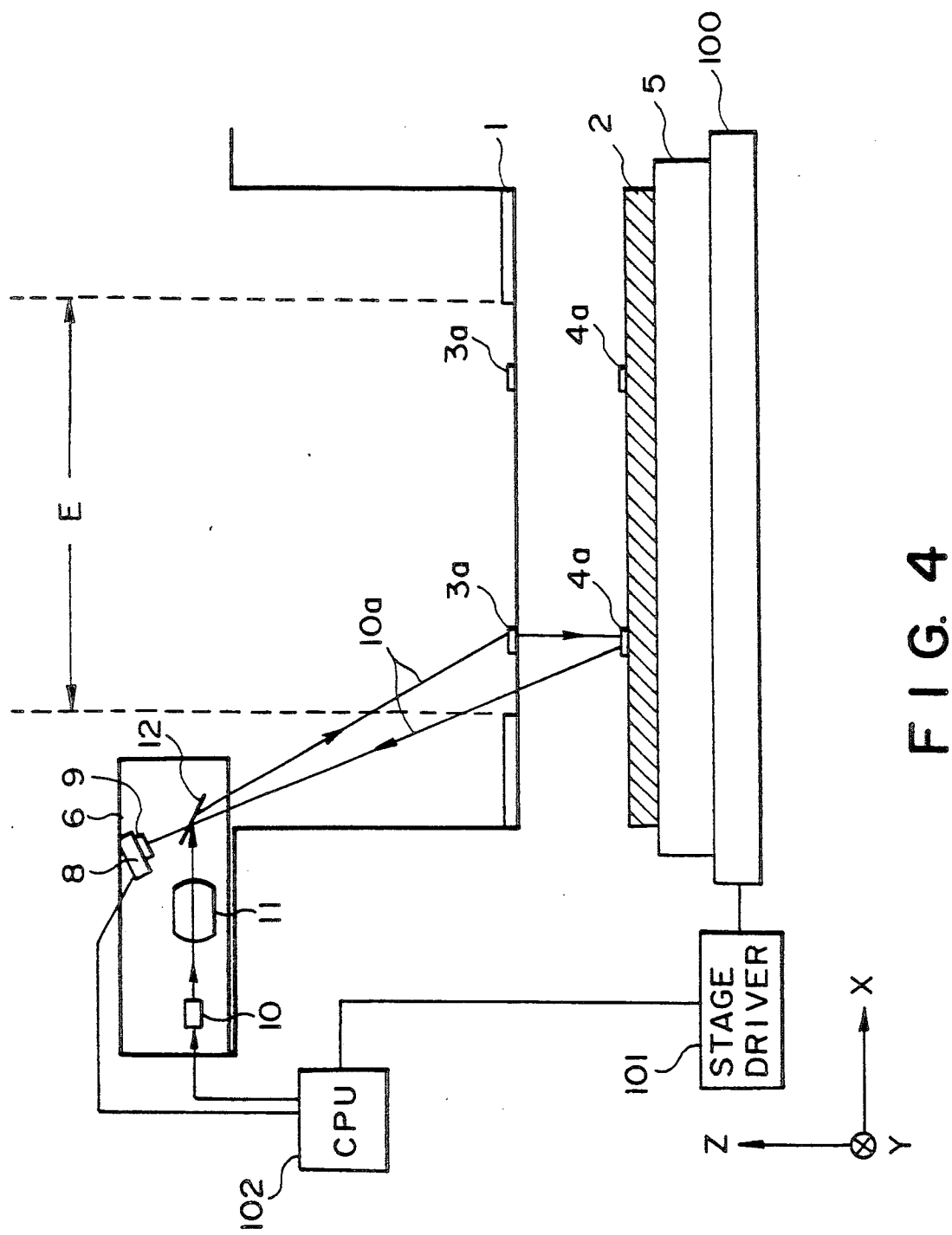
FIG. 4 is a schematic representation of a position detecting system according to a first embodiment of the present invention.

FIG. 4 is a schematic view of an exposure apparatus (e.g. an X-ray exposure apparatus) for manufacture of semiconductor microcircuit devices, into which a position detecting system according to a first embodiment of the present invention is incorporated. Denoted in the drawing at 1 is a mask having an integrated circuit pattern formed thereon; denoted at 2 is a semiconductor wafer; denoted and at 3a and 4a are first and second physical optic elements (alignment marks) which are formed on the mask 1 and the wafer 2, respectively, and each of which is provided by a Fresnel zone plate (lens or mirror element comprising a grating pattern). Denoted at 5 is a wafer chuck movable in the Z direction, for holding the wafer 2 by attraction. Denoted at 6 is an alignment head which accommodates therein various components necessary for the position detection or alignment purpose. Reference character E denotes a zone through which a radiation energy such as X-rays for transferring the circuit pattern of the mask 1 to the wafer passes. Denoted at 8 is a photodetector such as a CCD line sensor, for example; denoted at 9 is a light receiving surface of the photodetector 8; denoted at 10 is a light source which comprises, in this embodiment, a semiconductor laser having a variable emission wavelength; denoted at 11 is light projecting and collimating lens system; and at 12 is a half mirror.

X-Y stage 100 is operable to move the wafer, being attracted to the wafer chuck 5, in X and Y directions. Stage driver 101 is adapted to drive the X-Y stage 101 in the X and Y directions. Central processing unit (CPU) 102 is operable in response to output signals from the detector 8 to produce and supply instruction signals to the stage driver 101 to move the X-Y stage 100 so as to align the wafer 2 with the mask 1. The X-Y stage 100 is also effective to move the wafer chuck 5 and thus the wafer 4 in the z direction to a predetermined position, to thereby set a gap, in a predetermined range, between the mask and the wafer.

The X-Y stage 100 includes a fine-motion wafer stage which can be driven by a piezoelectric drive mechanism, and a rough-motion wafer stage that can be driven by a stepping motor drive mechanism. The stage driver 101 includes such a piezoelectric drive mechanism and such a stepping motor drive mechanism. For a minute displacement of a wafer, the CPU 102 supplies instruction signals to the piezoelectric drive whereas, for a relatively large distance movement, it supplies instruction signals to the stepping motor drive.

In this embodiment, light emanating from the light source (semiconductor laser in this example) 10 is collimated into a parallel light by means of the projecting lens system (collimator lens system) 11. After being reflected by the half mirror 12, the parallel light is projected in an inclined direction to the first physical optic element 3a on the mask (first object) 1 which may comprise, for example, a grating lens that is one type of Fresnel zone plate.

The first physical optic element (alignment mark) 3a is provided by a grating pattern having a light converging or diverging function (i.e., an optical power serving as a positive or negative lens) and operates to diffract and deflect a received light to emit light in a direction of a normal (−Z direction) to the surface of the mask (first object) 1. The light emanating from the first physical optic element 3a is incident perpendicularly upon a second physical optic element (alignment mark) 4a formed in a portion of the wafer (second object) 2, spaced by a predetermined distance from the first physical optic element 3a in the −Z direction. The second physical optic element 4a has a light converging or diverging function (i.e. an optical power serving as a positive or negative lens) and operate to reflectively diffract and deflect a receive light in the direction to the alignment head 6 and also to collect the same upon the detection surface 9 of the detector 8, the light passing through the half mirror 12. The illumination area on the mask 1 to be irradiated with the light is so set that it has a size larger than that of the first physical optic element 3a so as to assure that, even if the position of the first physical optic element 3a shifts slightly with a setting error of the mask when it is mounted to the exposure apparatus, the state of the light emanating from the first physical optic element 3a does not change, particularly with respect to the beam diameter, the angle of emission, the angle of opening, etc.

In this embodiment, as described, each alignment pattern on the mask 1 surface can be provided by a grating lens having a predetermined focal length, by which a light for the alignment purpose being projected from the alignment head 6 upon the mask 1 surface at an incline is deflected in the direction normal (−Z direction) to the mask 1 surface and is collected at a predetermined position (e.g. Z=−276.0 microns).

In this embodiment, the angle α of the inclined projection of light upon the mask 1 surface is preferably within the following range:

$$10 < \alpha < 80 \text{ (deg)}$$

On the other hand, an alignment pattern 4a on the wafer 2 can be provided by a grating lens comprising a pattern which is asymmetrical with respect to the Z axis. For example, this grating lens may be designed to obtain a focal length of 278.78 microns. It functions to direct the convergent (divergent) light having been transmissively diffracted by the grating lens on the mask 1 surface, toward the alignment head.

At this time, the alignment light denoted at 10a is influenced by the lens function of the grating lens and then is incident on the photoreceptor 8 accommodated in the alignment head 6. In the first embodiment, the mask and the wafer can be aligned with respect to the lengthwise direction of a scribe line (i.e. in the Y direction), in which direction each alignment pattern is provided.

Here, if the wafer 2 has a positional deviation in the Y direction relative to the mask 1 which is fixedly secured to the exposure apparatus, the grating lenses (alignment marks) 3a and 4a of the mask 1 and the wafer 2 are in such a relationship as that as assumed when the axial alignment of lens elements of an ordinary lens optical system is destroyed. As a result, the angle of emission of the emanating light 10a changes. This change causes displacement of the position of incidence of the light 10a upon the light receiving surface 9 of the detector 8 in the Y direction, by an amount corresponding to the relative positional deviation of the mask and the wafer in the Y direction, i.e., the position of the wafer relative to the mask with respect to the Y direction. In this example, the detector 8 comprises a CCD line sensor and, on the light receiving surface 9, the light receiving elements are arrayed codirectionally with the Y direction. As long as the relative positional deviation of the mask 1 and the wafer 2 is not so large, the displacement of the spot of light 10a on the light receiving surface 9 in the Y direction is proportional to the relative positional deviation of the mask and the wafer in the Y direction.

Assuming now that the mask and the wafer are relatively deviated by $\Delta\sigma$ in the Y direction, that the distance from the wafer 2 to the point of convergence (or the origin of divergence) of the light divergingly emanating from the grating lens 3a of the mask 1 and impinging on the wafer 2 is denoted by , and that the distance from the wafer 2 to the light receiving surface 9 is denoted by b, then a deviation or displacement $\Delta\delta$ of the center of gravity of the light 10a upon the light receiving surface 9 can be given by the following equation:

$$\Delta\delta = \Delta\sigma \times (b/a + 1) \tag{a}$$

Namely, the displacement $\Delta\delta$ of the gravity center position is being magnified "b/a +1" times larger than the positional deviation $\Delta\delta$ of the mask 1 and the wafer 2, and there is obtained an enlarging magnification $A = (b/a+1)$ of the displacement of the gravity center of the light, to the positional deviation. Here, the emission wavelength of the semiconductor laser 10 at this time, namely, the wavelength of the light 10a is λ.

If, as an example, a=0.5 mm and b=50 mm, the displacement $\Delta\delta$ of the gravity center position is magnified by 101 (one hundred and one) times larger than the positional deviation $\Delta\sigma$, in accordance with equation (a).

Here, the term "center of gravity of light" means such a point that, when upon the light receiving surface 9 a position vector of each point on that surface is multiplied by the light intensity of that point and the thus obtained products are integrated over the entire surface, the integrated value has a "zero vector".

Assuming now that under the wavelength λ, that the focal length of the grating lens 3a of the mask 1 is f and that the spacing between the mask 1 and the wafer 2 is g, then the following relation is given:

$$a = f + g$$

Accordingly, under the wavelength λ, the magnification A of the displacement of the gravity center position of the light to the positional deviation is given by:

$$A = b/(f+g) + 1$$

If the radius of each ring of the grating pattern constituting an alignment mark is denoted by $r_m$ (m is the ordinal number of the ring), then there is a relationship to the focal length f which is expressed by:

$$\sqrt{r_m^2 + f^2} - f = m\lambda$$

It follows therefrom that:

$$f = [r_m^2 - (m\lambda)^2]/2m\lambda$$

If the wavelength of the alignment light 10a changes by $\Delta\lambda$, then the focal length f changes by $\Delta f$ which can be given by:

$$\begin{aligned}\Delta f &= -\Delta\lambda/2m\lambda^2 \times [r_m^2 - (m\lambda)^2]\\ &= -\Delta\lambda/\lambda \times f\end{aligned}$$

Here, the magnification of the displacement of the gravity center position of the light 10a to the positional deviation changes by $\Delta A$ which is given by:

$$\begin{aligned}\Delta A &= -b\Delta f/(f+g)^2\\ &= bf/(f+g)^2 \times \Delta\lambda/\lambda\\ &= f/(f+g) \times 1/\lambda \times (A-1)\Delta\lambda\end{aligned}$$

Accordingly, the magnification becomes equal to "$A + \Delta A$".

If, as an example, $A = 101$, the focal length f under the wavelength $\lambda$ is $f = 0.187$ mm and $g = 0.03$ mm, then:

$$\Delta A - 0.86 \times \Delta\lambda/\lambda \times (A-1)$$

$\Delta\lambda/\lambda = 0.1$, then $\Delta A = 8.6$.

Accordingly, where the mask 1 and the wafer 2 have a relative positional deviation of an amount $\Delta\sigma$, if the wavelength of the light from the light source is shifted by 10 %, for example, by changing the emission wavelength of the semiconductor laser 10, then the position of the center of gravity of the light 10a upon the light receiving surface 9 displaces by $\Delta\delta'$ which can be given by:

$$\begin{aligned}\Delta\delta' &= \Delta A \times \Delta\sigma\\ &= f/(f+g) \times 1/x \times (A-1) \times \Delta\lambda \times \Delta\sigma\\ &= 8.6 \times \Delta\sigma\end{aligned} \quad (b)$$

It is seen from the foregoing that, where the grating lenses (alignment marks) of a mask and a wafer are so designed that the position gravity of the light 10a on the light receiving surface 9 does not shift with a change in the wavelength of the light 10a (i.e. $\Delta\delta' = 0$) as the mask and the wafer have no relative positional deviation in the Y direction (i.e. $\Delta\sigma = 0$), the magnitude $\Delta\sigma'$ can be proportional to the deviation $\Delta\sigma$ between the mask and the wafer. Accordingly, where the values of $\lambda$, $\lambda\Delta$ and g are set beforehand and the values f and A are detected and the value $\Delta A$ is calculated beforehand, it is possible to determine the relative positional deviation $\Delta\sigma$ of the mask and the wafer by detecting the magnitude $\Delta\sigma'$ from the output signal of the detector 8, processed by the CPU 102, and by substituting the obtained into equation (b). Here, the direction of displacement of the gravity center position of the light 10a as the emission wavelength of the semiconductor laser 10 is shifted by $\Delta\lambda$, corresponds to the direction of relative positional deviation of the mask and the wafer, namely, it corresponds to the positiveness or negativeness of the magnitude $\delta\lambda'$. Thus, where such a relationship is detected beforehand, it is possible to detect the direction of positional deviation, from the direction of displacement of the position of the center of gravity of the light 10a as the wavelength is shifted.

Here, it is not always necessary that the magnitude $\delta\sigma'$ when $\Delta\sigma = 0$ is set to be equal to 0 (zero). Rather, where an absolute value of $\Delta\sigma'$ when $\Delta\sigma = 0$ as well as the direction of displacement of the gravity center position of the light 10a as the wavelength is shifted are detected beforehand, it is possible to determine the relative positional deviation of the mask and the wafer by substituting, into equation (b), a difference between the magnitude $\Delta\delta'$ at the time of position detection and the magnitude $\Delta\sigma'$ when $\Delta\sigma = 0$.

An alignment process to be adopted for the mask-to-wafer alignment may be such as follows:

In a first example the relationship of a displacement $\Delta\delta'$ of the position of the center of the light 10a on the light receiving surface 9, as the wavelength is changed, to the relative positional deviation $\Delta\sigma$ between a mask and a wafer, namely, equation (b), is predetected. Then, at the time of actual position detection, the semiconductor laser 10 is energized to produce in sequence two light beams having two different wavelengths. From the output signals of the photodetector 8, the gravity center position of the light 10a provided by each of the two wavelengths is detected, and the displacement $\Delta\delta'$ of the gravity center position is calculated. From the obtained $\Delta\sigma'$ and by using equation (b), the relative positional deviation $\Delta\sigma$ of the mask and the wafer is determined, and the mask or wafer is moved by an amount corresponding to the determined positional deviation $\Delta\sigma$.

In a second method at the time of actual position detection, the semiconductor laser 10 is energized so as to produce in sequence two light beams of two different wavelengths which are predetermined. From the output signals of the detector 8, the position of the center of gravity of the light 10a provided by each of the two wavelengths, is detected. Then, the displacement $\Delta\delta'$ of the position of the center of gravity as well as the direction that cancels the positional deviation $\Delta\sigma$, are determined by calculation. Then, the mask or the wafer is moved in accordance with the detected direction by an amount corresponding to the magnitude $\Delta\delta'$. At the moment of completion of the movement, lights of two different wavelengths are outputted again in sequence, and detection of displacement $\Delta\delta'$ of the position of the center of gravity is effected again. The above-described process is repeated until the positional deviation $\Delta\sigma$ is reduced into a predetermined tolerable range.

Figure 5A:
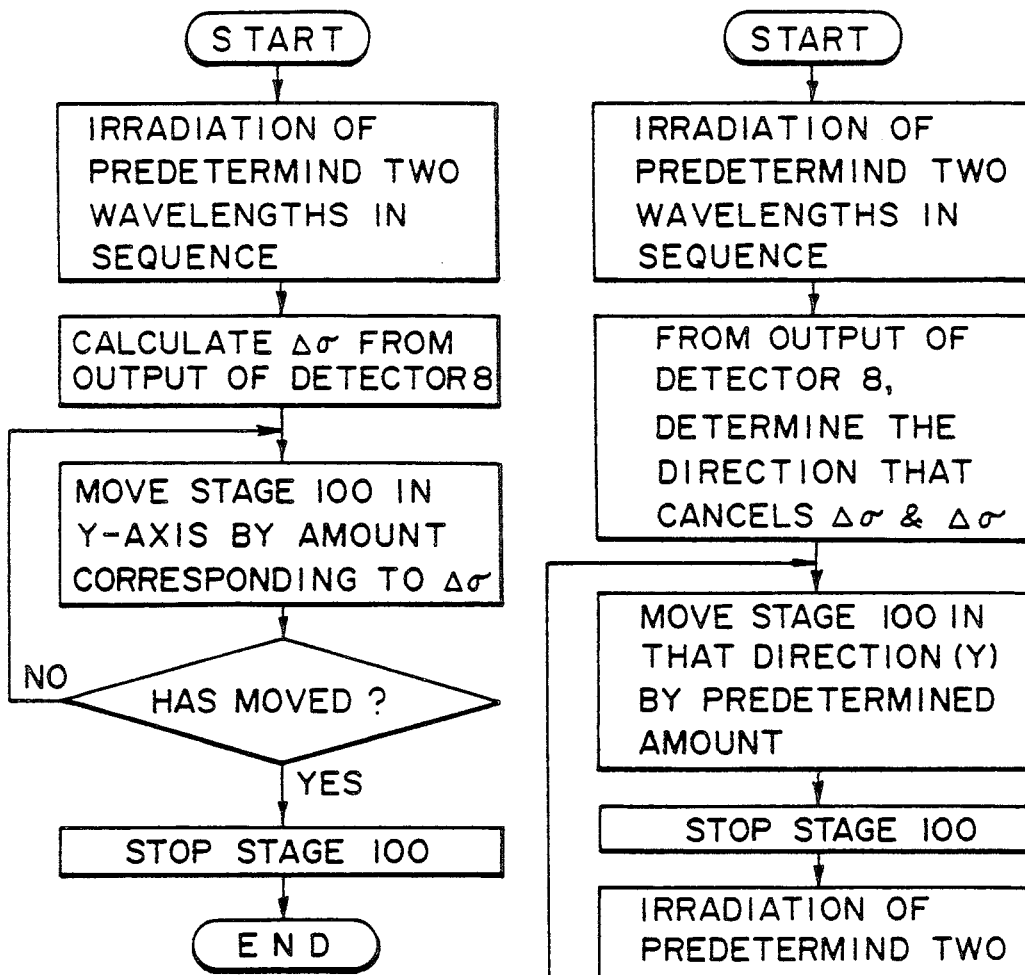
FIGS. 5A and 5B are flow charts, respectively, each illustrating an example of alignment sequence to be made with use of the position detecting system of FIG. 4.
Figure 5B:
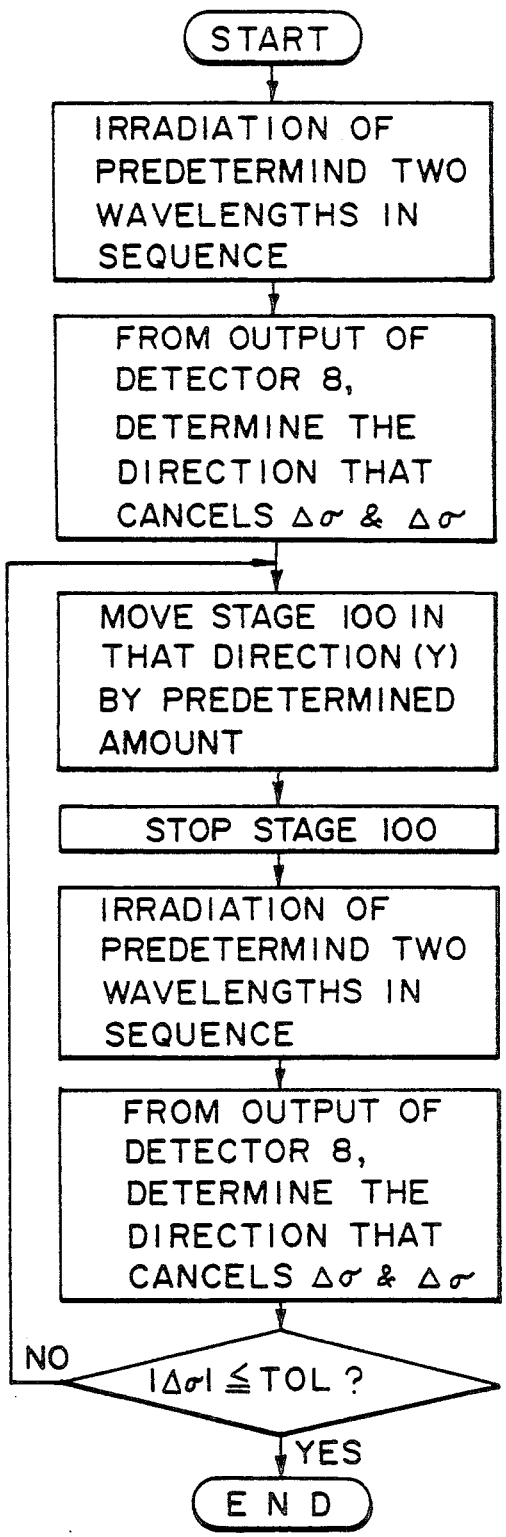

The above-described procedures using the CPU 102 are illustrated in the flow charts of FIGS. 5A and 5B.

In the present embodiment, as described, it is not necessary to set a reference point on the light receiving surface 9 of the photodetector 8 for detection of the position of the center of gravity of the alignment light 10a. In other words, it is not necessary to determine the position of the center of gravity of the light 10a upon the light receiving surface to be assumed when $\Delta\sigma = 0$. By changing the emission wavelength of the semiconductor laser 10 to shift the wavelength of the light 10a, it is possible to detect the relative positional deviation or the relative position of two objects such as a mask and a wafer.

Further, in the present embodiment, even if the wafer 2 is inclined, the displacement of the gravity center position of the light 10a on the light receiving surface 9 resulting from such inclination does not change with the change in the emission wavelength of the semiconductor laser 10. Therefore, the magnitude $\Delta\delta'$ is unchanged. This is also the case with a change in the position of the light projecting means (elements 10, 11 and 12) or the detecting means (elements 8 and 12), in the X-Y plane. Therefore, only by detecting displacement $\Delta\delta'$ of the position of the center of gravity, it is possible to detect the position of the wafer without being influenced by any inclination of the wafer or any change in the position of the light projecting means or the light detecting means.

In the present embodiment, a semiconductor laser is used as the light source and, by controlling an electric current to be injected thereto, the emission wavelength is changed.

As a result, only by detecting the shift of the gravity center position of the light 10a while changing the emission wavelength, it is possible to detect an absolute value of the relative positional deviation or the relative position of a wafer to a mask. Accordingly, the present embodiment is more effective than an arrangement wherein two light beams of different wavelengths are produced from separate light sources.

Referring back to FIG. 4, the alignment light 10a is transmissively diffraction by a grating lens 3a of the mask 1 and then is reflectively diffracted by a grating lens 4a of the wafer 2, and finally it is received by the light receiving surface 9 of the photodetector 8, accommodated in the alignment head 6 with the misalignment between the optical axes of the grating lenses of the mask and the wafer being magnified by n times larger, with a predetermined magnification dependent on the wavelength. The gravity center position of the light 10a on the light receiving surface 9 is detected from the output signal of the photodetector 8.

Here, the focal length of each grating lens (alignment mark) 3a or 4a is determined while taking into account the magnitude of the gap between the mask and the wafer at the time of exposure (pattern transfer) as well as the magnitude of displacement $\Delta\delta$ of the position of the center of gravity, from a predetermined reference position, to the relative positional deviation $\Delta\sigma$ of the mask and the wafer in the detection using light of a predetermined wavelength.

By way of example, such a proximity X-ray exposure system will now be considered in which the position of the center of gravity of light upon a light receiving surface 9 can be detected with a relative positional deviation between a mask and the wafer being magnified by x100 in the detection using light of a predetermined wavelength and with an exposure gap being maintained at 30 microns.

Figure 6:
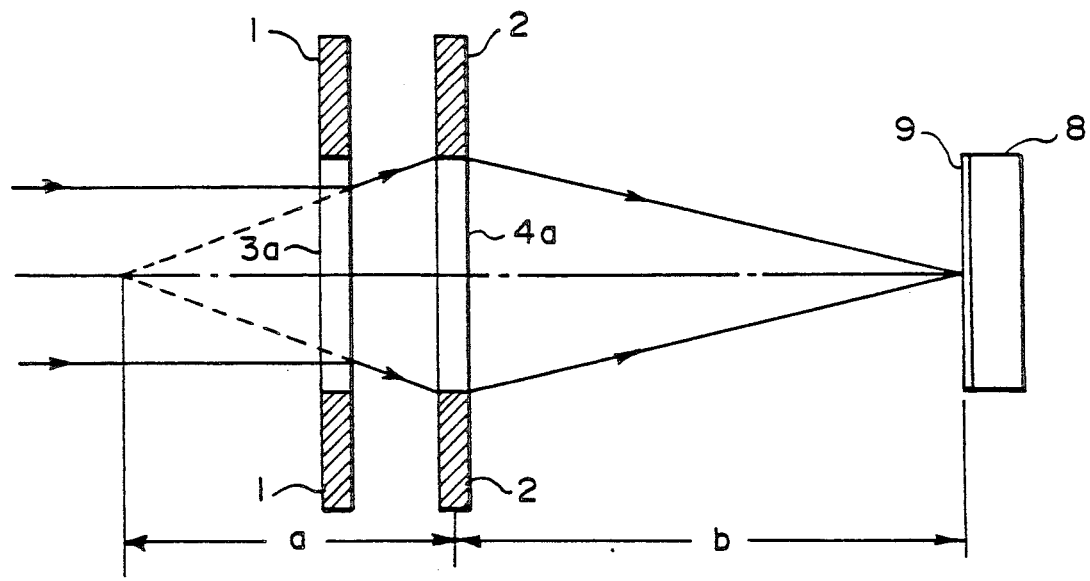
FIGS. 6 and 7 are schematic representations, respectively, illustrating examples of the power arrangement of alignment patterns formed on a mask and a wafer.
Figure 7:
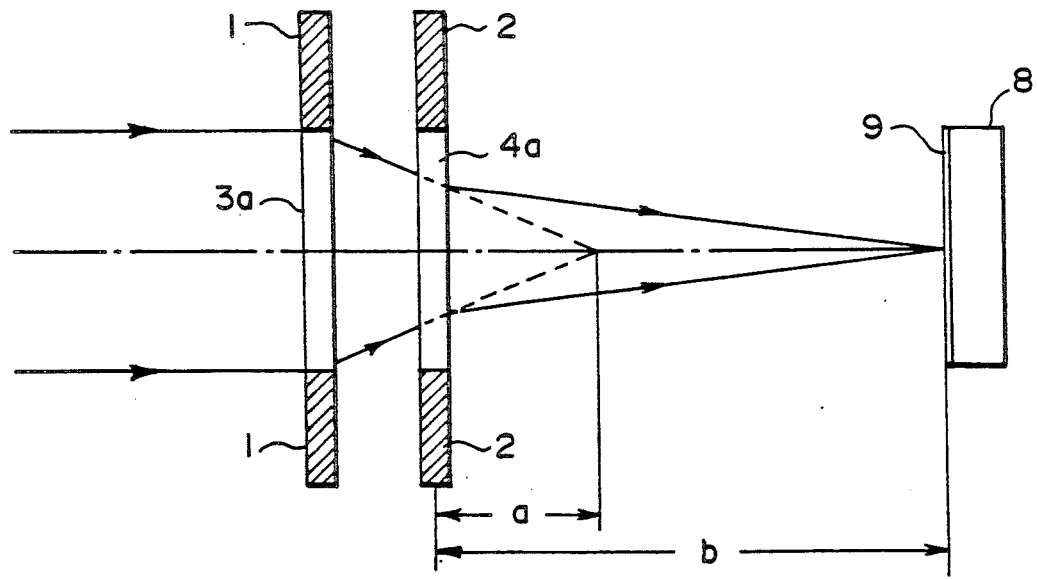

A semiconductor laser is used in that case, for example, to provide an alignment light of a wavelength of 0.83 micron. The alignment light passes through a light projecting lens system 11 in an alignment head 6 and is transformed into parallel light. The parallel light then passes through a grating lens system comprising two grating lenses (zone plates) which are provided on a wafer 2 and a mask 1 as alignment marks 3a and 4a, so that the light passes first the mask and then the wafer in sequence. Examples of the refracting power arrangement of such a grating lens system are illustrated in FIGS. 6 and 7. In these drawings, the wafer grating lens 4a is illustrated as being replaced by a transmission type grating lens equivalent to reflection type one.

FIG. 6 shows an example wherein a grating lens 4a of a wafer 2 has a positive refracting power, while a grating lens 3a of a mask 1 has a negative refracting power. FIG. 7 shows an example wherein a grating lens 4a of a wafer 2 has a negative refracting power, while a grating lens 3a of a mask 1 has a positive refracting power.

Whether a negative refracting power or a positive refracting power is to be used is determined, depending on whether negative order diffraction light or positive order diffraction light is to be used.

In these particular cases, the grating lens 3a of the mask 1 has a diameter 300 microns, for example, while the grating lens 4a of the wafer 2 has a diameter 280 microns, for example. The disposition of the components and the focal lengths of the optical elements are determined so that the center of gravity of light upon the detecting surface 9 is displaceable with an enlarging magnification of x100 to a positional deviation between the mask and the wafer (misalignment between optical axes) and that, as a result, the light spot upon the light receiving surface 9 has a diameter (diameter of an Airy disk $e^{-2}$) of about 200 microns.

The optical geometry of a mask grating lens 3a and a wafer grating lens 4a, usable in this embodiment, will now be explained.

First, a mask grating lens 3a can be designed so that, when a parallel light of a predetermined beam diameter is incident obliquely thereupon at a predetermined angle, the deflected light is focused at a predetermined position. Usually, a pattern of a grating lens may be that of an interference fringe which can be formed on a lens surface (mask or wafer surface on which the grating lens is provided) in an occasion where mutually coherent light sources are disposed at a light source position (object point) and the position of an image point. Assuming, a coordinate system is defined such that the origin is at the middle of the width of the scribe line on the mask, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the wafer surface and with the projection to the X-Y plane being perpendicular to the scribe line direction, is imaged after being reflectively diffracted by the grating lens 3a, at the position of a converging point $(x_1, y_1, z_1)$, can be expressed in the following manner, with the contour position of each grating ring being denoted by x and y:

$$y\sin\alpha + P1(x,y) - P2 = m\lambda/2 \tag{1}$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the center wavelength of the alignment light to be inputted to the grating lens 3a and m is an integral number.

Assuming now that a chief ray is such a ray being incident with an angle $\alpha$ and passing through the origin on the mask surface and then impinging upon a convergent point $(x_1, y_1, z_1)$, then the right side of equation (1)

shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point $(x, y, 0)$ on the mask and then impinges on the point $(x_1, y_1, z_1)$.

On the other hand, a grating lens 4a to be provided on a wafer 2 can be designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by: $(x_1, y_1, z_1-g)$.

Assuming now that the mask 1 and the wafer 2 are to be aligned with respect to the y-axis direction and that, upon completion of alignment, the alignment light is focused at a point $(x_2, y_2, z_2)$ on the light receiving surface 9, then equations regarding a group of curved lines of a grating lens of a water can be expressed, in the coordinate system defined hereinbefore, as follows:

$$\sqrt{(x-x_2)^2 + (y-y_2)^2 + z_2^2} - \sqrt{(x-x_1)^2 + (y-y_1)^2 + (z_1-g)^2} = \sqrt{x_2^2 + y_2^2 + z_2^2} - \sqrt{x_1^2 + y_1^2 + z_1^2} + m\lambda/2 \quad (2)$$

Equation (2) is such an equation that satisfies a condition by which, assuming that the water surface is "$z = -g$" and that the chief ray is such a ray that passes the origin on the mask surface and a point $(0, 0, -g)$ on the water surface and additionally a point $(x_2, y_2, z_2)$ on the light receiving surface 9, the difference in length between the path of the chief ray and the path of a ray passing the grating lens $(x, y, -g)$ on the wafer surface becomes equal to a multiple, by an integral number, of a half wavelength.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern of relief shape having a rectangular section, for example. The fact that, in equations (1) and (2), each grating line (ring) is defined at a position which corresponds to a multiple, by an integral number, of a half wavelength with regard to the chief ray, means that the linewidth ratio of the transparent portion and the light blocking portion is 1:1 in the case of the grating lens 3a on a mask, and that the line and space ratio of rectangular phase grating is 1:1 in the case of the grating lens 4a on the wafer.

As a specific example, a grating lens 3a on a mask was formed by transferring, onto an organic thin film of polyimide, a grating lens pattern of a reticle prepared by use of electron beam exposure technique.

On the other hand, a grating lens on a wafer was formed by preparing on a mask a pattern to be printed on a wafer and then by transferring the pattern by use of a lithographic process.

Figure 8A:
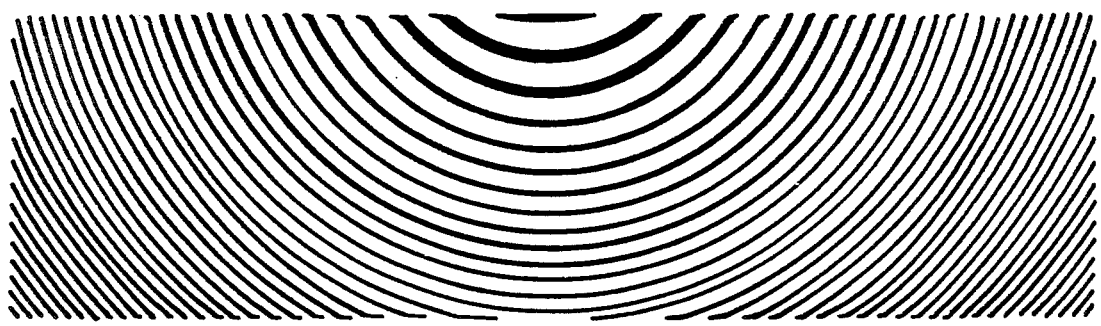
FIGS. 8A and 8B are enlarged views, respectively, each showing an example of alignment pattern provided on a mask or a wafer.
Figure 8B:
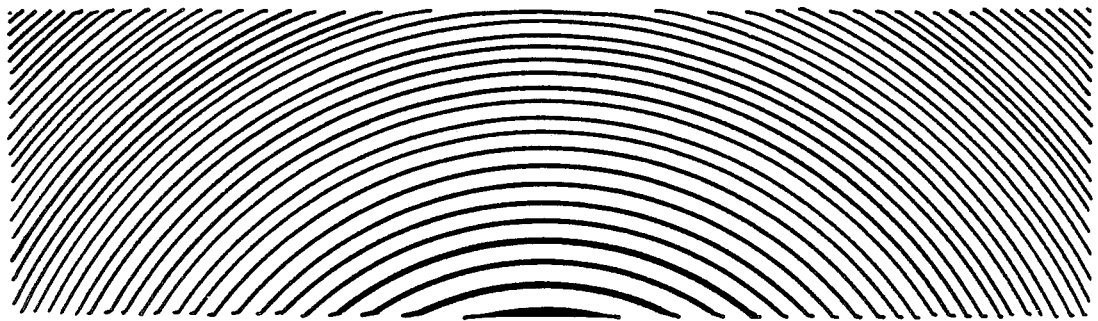

An example of a grating lens (alignment mark) 4a to be provided on a wafer is illustrated in FIG. 8A, and an example of a grating lens 3a to be provided on a mask is illustrated in FIG. 8B.

Referring back to FIG. 4a, description will now be provided of a case, in this embodiment, where a particular positional deviation is given between a mask and a wafer.

Light emanating from a semiconductor laser 10 as an alignment light source, of a wavelength 830 nm, passes through the projecting lens system 11 and is transformed into a parallel light of a half width of 600 microns. The parallel light is projected from the alignment head 6 upon the mask 1 surface at an angle of 17.5 degrees with respect to the normal (Z direction) to the mask 1 surface.

On a scribe line upon the mask 1 surface, grating lenses 3a each having a width 60 microns and a length 280 microns are formed. Also, on a scribe line upon the wafer surface, grating lenses 4a each having the same size of the grating lens 3a are formed. For a relative positional deviation between the mask and the wafer, a minute displacement is provided by the fine-motion wafer stage, driven by the piezoelectric drive, while a relatively large displacement is provided by the rough-motion wafer stage, driven by the stepping motor drive. For measurement of the displacement, a measuring machine (resolution 0.001 micron) was used and the measurement was made in a temperature controlled chamber at a controlled temperature of $23 \pm 0.5$ °C. A one-dimensional (linear) CCD line sensor was used as the photoreceptor, in the alignment head 6, for detecting the position of the center of gravity of light. The line sensor was disposed so that the direction in which its sensing elements were arrayed was correlated with the direction (y-axis direction) with respect to which any positional deviation was to be detected. Output signals from the line sensor are processed so as to be standardized with respect to the total light intensity in the whole light receiving region. This assures that, even if the output power of the alignment light source (semiconductor laser) changes slightly, the measured value as obtainable from the line sensor system correctly represents the position of the center of gravity.

The resolution of such a line sensor for the position of the center of gravity may depend on the power of the alignment light used. When the measurement was made by using a semiconductor laser of 50 mW, the result was 0.2 micron.

In a design example of a mask grating lens 3a and a wafer grating lens 4a in accordance with the first embodiment, the grating lenses are so set that the position of the center of gravity of a signal light is displaceable upon a sensor surface while magnifying by ×100 a positional deviation between a mask and a wafer.

If the relative positional deviation of the mask and the wafer is equal to 3.0 microns, the center of gravity of the light 10a is at a position of a distance of about 300 microns from the position of the center of gravity (reference point) of the alignment light on the line sensor to be assumed when the positional deviation is equal to 0.0 micron.

If, in response to a signal from the CPU 102, the injection current to the semiconductor laser in the alignment head is changed by 50 mA to thereby shift the emission center wavelength from 830 nm to 838 nm, then the rate of wavelength modulation is $\Delta\lambda/\lambda = 9.6 \times 10^{-3}$. Thus, the change in magnification of the deviation detecting system is of an amount $\Delta A$ =0.82. In such case, if the mask and the wafer have a relative positional deviation of 3 microns, the displacement of the position of the center of gravity of the light 10a is 2.48 microns. If, on the other hand, the relative positional deviation of the mask and the wafer is 0.7 micron, at the same wavelength modulation rate the displacement of the gravity center position on the light receiving surface of the photodetector is 0.574 micron.

In this manner, provided that the modulation rate of the wavelength of the light source is predetermined, from the displacement $\Delta\delta'$ of the gravity center position upon the light receiving surface of the photodetector as assumed before the wavelength modulation and that as assumed after the wavelength modulation, it is possible to determine the relative positional deviation of the mask and the wafer, in accordance with the following equation:

$$\Delta\sigma = \Delta\sigma'/\Delta A \quad (3)$$

Figure 9:
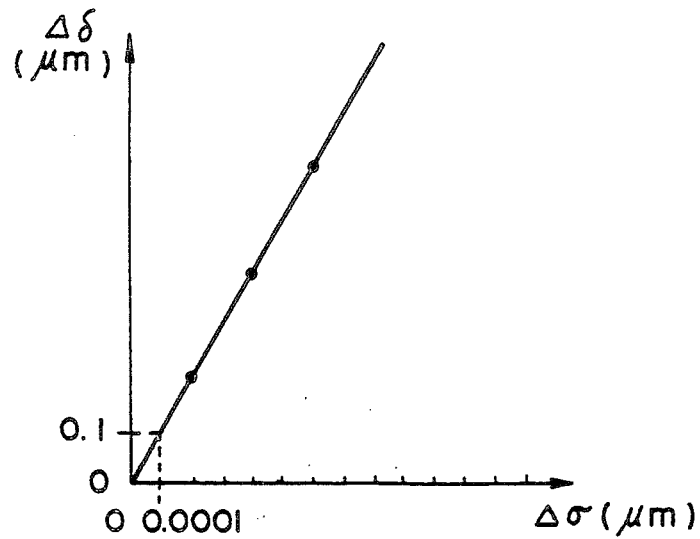
FIG. 9 is a graph showing the relationship between a relative positional deviation $\Delta\sigma$ of a mask and a wafer and a displacement $\Delta\delta$ of the gravity center position of a light spot.

FIG. 9 illustrates the manner of change in the position of the center of gravity of the light as detected by a sensor when a varying relative positional deviation is applied to a mask and a wafer. As seen from FIG. 9, the position of the center of gravity of the light is in a linear relationship with the relative positional deviation of the mask and the wafer, while taking the magnification of the grating lens system as a proportional constant.

In regard to the wavefront aberration of the light 10a, in this embodiment, smaller wavefront aberration is preferable. However, such wavefront aberration grows significantly with a larger numerical aperture (NA) of the used grating lenses. Accordingly, when a grating lens (alignment mark with optical power) is to be set in a limited area, use of a grating lens having smaller numerical aperture is desirable.

In the present embodiment, as described, light from the alignment head 6 is inputted obliquely to a mask and, additionally, the light from a wafer goes back to the alignment head along an optical path which is also inclined. This assures measurement of relative positional deviation of the mask and the wafer with the alignment head being disposed outside the zone E (FIG. 4).

FIG. 10 is a schematic representation of a position detecting system according to a second embodiment of the present invention, which is incorporated into a semiconductor device manufacturing exposure apparatus. Elements similar to those shown in FIG. 4 are assigned corresponding numerals. While major components of this embodiment are the same those of the FIG. 4 embodiment, in the present embodiment two semiconductor lasers 10-1 and 10-2 having different emission center wavelengths are provided in the alignment head as a light source means. The optical path setting is such that the chief rays of the lights from the semiconductor lasers 10-1 and 10-2 are superposed one upon another as the lights emanate from the half mirror 12a. CPU 102 operates to selectively or alternately energize the semiconductor lasers 10-1 and 10-2 for the change of the wavelength of light illuminating the grating lenses (alignment marks) 3a and 4a. Namely, the CPU 102 alternately energize the two semiconductor lasers (although the lasers may be energized at the same time) to thereby shift the wavelength of the mark illuminating light. To this end, shutters may be provided in front of corresponding semiconductor lasers, respectively, and these shutters may be opened/closed alternately.

The semiconductor laser 10-1 has a center wavelength of 830 nm, and the semiconductor laser 10-2 has a center wavelength of 780 nm. In the design of the grating lenses 3a and 4a to be formed on the scribe lines 1a and 2a, respectively, the parameter setting was made on an assumption that light of a wavelength 805 nm was to be used. Also, the wavelength modulation rate was set to be $\Delta\lambda/\lambda = 6.2 \times 10^{-2}$. The focal length f of the mask grating lens 3a as well as the gap g between the mask and the wafer at the time of exposure, are the same as those of the first embodiment. The magnification A of the grating lens system for detection of relative positional deviation is "x100" with respect to light of a wavelength 805 nm, and the magnitude $\Delta A$ of the magnification change is 5.33 (equation (3)).

FIG. 11 is a perspective view schematically illustrating a major part of a semiconductor device manufacturing exposure apparatus into which a position detecting system according to a third embodiment of the present invention is incorporated. In this embodiment, a white light source 10' is used as a light source, and a movable diffraction grating 13 and a slit plate 14 are provided in the alignment head 6 as a wavelength selecting means. The diffraction grating 13 is disposed obliquely to the light inputted thereto, and the angle of inclination thereof can be changed. Diffracted rays of different wavelengths, emanating from the diffraction grating 13, have different emission angles. In consideration thereof, the slit plate 14 formed with a slit or a pinhole, for example, of a predetermined size, is disposed at a predetermined position to be irradiated with the diffraction light from the diffracting grating 13, and by rotationally moving the diffraction grating 13 so as to change the angle of inclination thereof, the wavelength of light passing through the aperture (slit or pinhole) of the slit plate 14 can be changed. Thus, for the wavelength shift, the CPU 102 operates to rotationally move the diffraction grating 13 by a predetermined angle to thereby change the wavelength of light, illuminating the grating lenses (alignment marks) 3a and 4a.

Where a light source of low coherency is used, as in the present embodiment, it is possible to suppress unwanted light such as speckle on the light receiving surface 9, resulting from scattered light, for example, from edges of alignment marks of the mask and the wafer or from a resist surface on the wafer.

The element of the wavelength selecting means is not limited to a diffraction grating, but any other elements such as, for example, a prism, an etalon or color filter assembly, may be used. Where a color filter or the like is to be used, it may be disposed just before the light receiving surface 9 of the photodetector 8, not just after the light source 10'. In that case, white light may be projected to the grating lenses 3a and 4a, and the diffracted light may be wavelength-selected by the wavelength selecting means, such that only desired wavelength to be detected can be inputted to the light receiving surface 9. Where the combination of a diffraction grating 13 and a slit plate 14 is used, the opening (slit or pinhole) of the slit plate 14 may be set so that, even if the angle of emission of the light 10a from the wafer 2 changes with the relative positional deviation of the mask and the wafer, the light of a wavelength or wavelengths to be used for the detection are not blocked as long as the relative positional deviation of the mask and the wafer is in a certain range.

Figure 12:
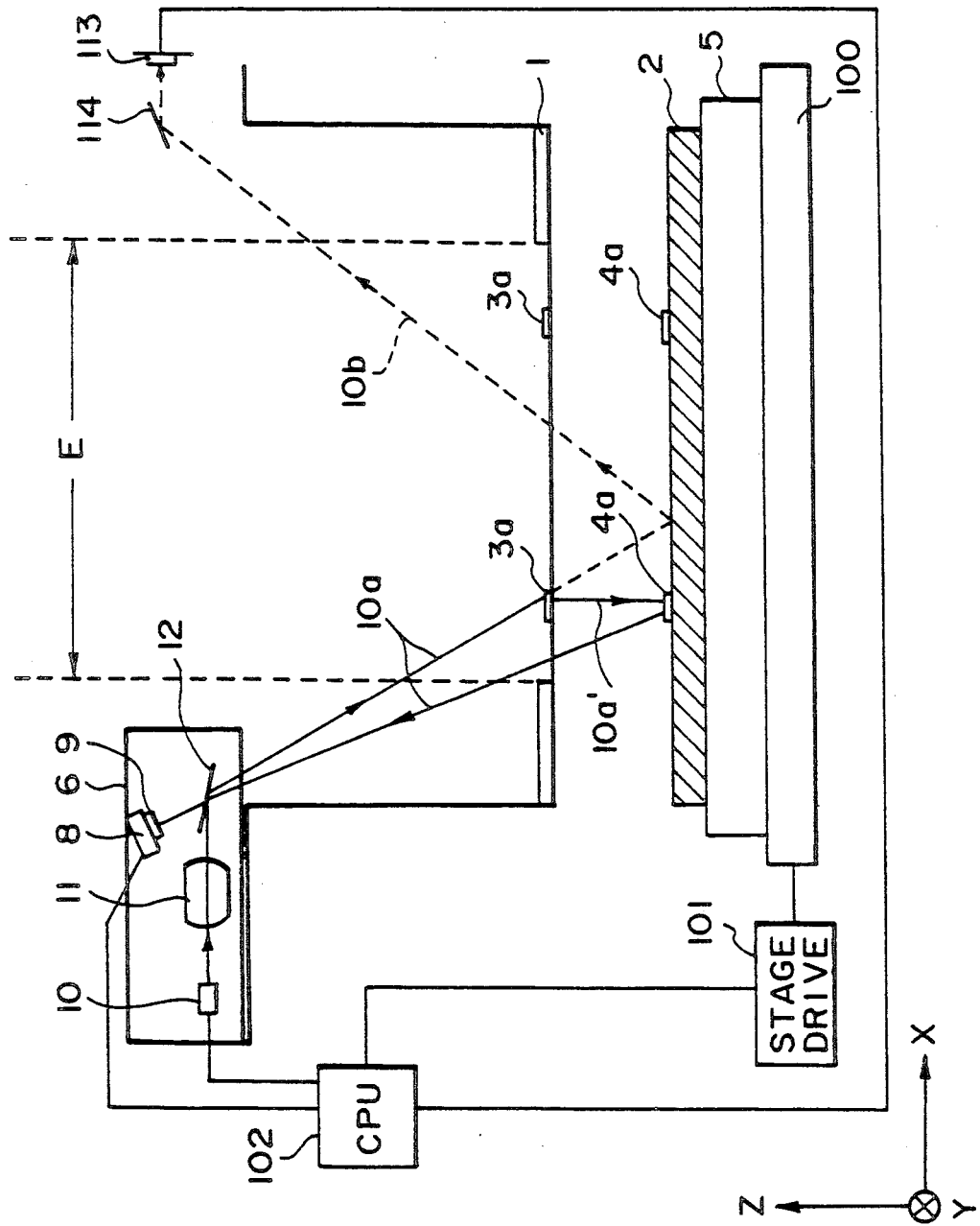

FIG. 12 illustrates a fourth embodiment of the present invention which, like the preceding embodiments, is applied to a position detecting system for a mask (reticle) and a wafer in a semiconductor device manufacturing exposure apparatus. The wafer is covered by a resist of a predetermined thickness, formed by spin coating.

In this embodiment, the wavelength of the alignment light 10a is selected on the basis of the film thickness and the spectral reflectance of the resist, so as to assure that the intensity of the light 10a collected upon the light receiving surface 9 of the photodetector 8 is constantly not lower than a predetermined level.

In the present embodiment, prior to detection of the positional deviation, the spectral reflectance as determined by the film thickness of the resist is measured. For this purpose, spectral reflectance measuring optical means is provided which comprises an alignment head 6, a light receiving element 113 and a mirror 114 mounted to a stationary frame of the exposure apparatus. Before a mask 1 is mounted with respect to the exposure zone E (although the measurement may be made after the mask mounting), light 10a is projected from a light source 10 in the alignment head 6 to the wafer 2 surface, and reflection light 10b from the wafer 2 surface is received by the light receiving element 113 and the intensity of the received light is measured by detecting the intensity level of an output signal from the light receiving element 113.

The light source 10 may comprise plural lasers having different emission wavelengths or a variable wavelength laser (such as a semiconductor laser or dye laser, for example) whose emission wavelength is controllable or, alternatively, a super luminescent diode (SLD) that can emit a semi-monochromatic light or a white light source in combination with a wavelength selecting means (such as a prism, etalon, diffraction grating, color filter assembly or the like). With the selectable wavelength region, the wavelength is scanned and the spectral refractance from the wafer 2 surface coated with a resist is measured. On the basis of measured data, at least two wavelengths to be used for the positional deviation measurement are determined.

In the system shown in FIG. 12, the wavelength determination may be made in the following manner, on the basis of the angle $\alpha$ of incidence of the light 10a upon the mask 1 and the angle $\alpha'$ of incidence of the light 10a' diffracted by the mark 3a of the mask and impinging on the wafer 2 surface.

Generally, the intensity Im of reflection light which results from the light of an intensity I and a wavelength $\lambda$, incident at an angle $\theta$ on a thin film, of a film thickness l and a refractive index n, formed on a substrate having a refractive index $n_o$, can be given by the following equation, while taking into account the multi-reflection within the thin film:

$$Ir = [4R\sin(\delta/2)]/[(1 - R)^2 + 4R\sin^2(\delta/2)]$$
$$= (4\pi nl\cos\theta)/\lambda$$
$$R = r \times r'$$

where r is the amplitude reflectance at the interface between the thin film and the substrate, and r' is the amplitude reflectance at the interface between the thin film and the surroundings (such as atmosphere) which contact the thin film.

Since Ir becomes maximum when $\delta$ satisfies the relation $\delta = \frac{1}{2} \times (2m-1)\pi$, where m is an integer, the reflectance (wherein the multireflection is being taken into account) comes to a maximum when the following relation is satisfied:

$$(4\pi nl\cos\theta)/\lambda = \frac{1}{2} \times (2m-1)\pi$$

Assuming now that the wavelength which provides a peak of reflectance, at an angle of incidence of $\theta$, is denoted by $\lambda(\theta)$ then such a wavelength can be given by:

$$\lambda(\theta) = (4nl\cos\theta)/(2m-1)$$

From this, it follows that the wavelength $\lambda(\theta')$ that provides a peak of reflectance, corresponding to another angle of incidence of $\theta'$ can be given by using $\lambda(\theta)$, as follows:

$$\lambda(\theta') = \cos\theta'/\cos\theta \times \lambda(\theta) \quad (4)$$

Generally, the dependence, upon the angle of incidence ($\theta$), of the wavelength that provides a reflectance of a desired proportion to the peak value, can be given in accordance with equation (4).

Therefore, by measuring the spectral reflection characteristics of the wafer 2 with respect to the light 10a at a particular angle of incidence ($\alpha'$) beforehand, in accordance with equation (4) it is possible to determine the wavelength that provides a reflectance of a desired proportion to the peak value.

Further, any wavelength to be selected for providing any reflectance of a certain proportion to the peak value can be set as desired, and such a wavelength may be determined while taking into account the wavelength selectable range of a used light source.

It is to be noted here that the spectral intensity characteristics of the light 10a on the light receiving surface 9 of the photodetector 8, corresponding to the film thickness of the resist, may be measured by using the positional deviation measuring system comprising the alignment head 6, the mask 1 and the wafer 2.

After determination of the wavelengths to be used, the relative positional deviation or the relative position of the mask and the wafer is defected in this embodiment essentially in the same manner as has been described with reference to FIG. 4.

Figure 13:
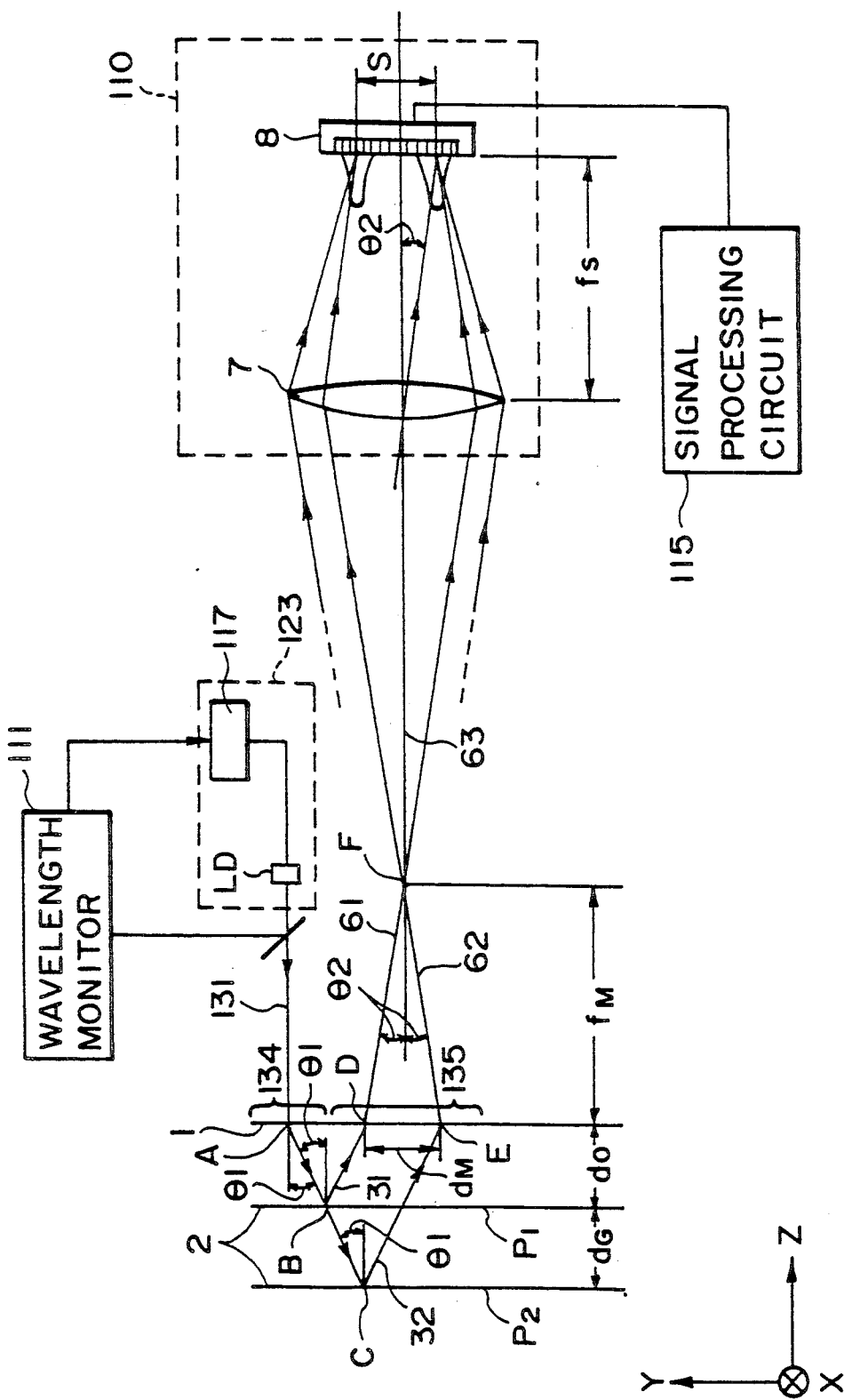
FIG. 13 is a schematic representation of an interval measuring system, arranged in accordance with a fifth embodiment of the present invention.
Figure 14:
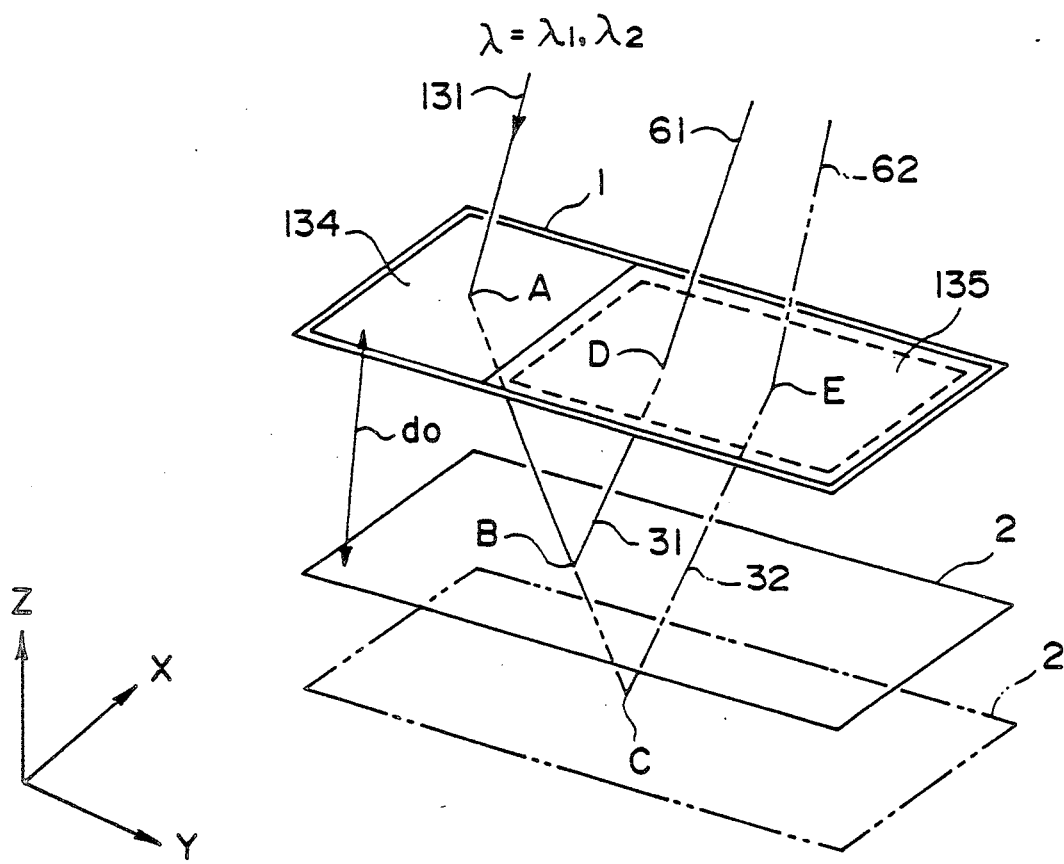
FIG. 14 is a perspective view, schematically illustrating optical paths in the neighborhood of a mask and a wafer, in the interval measuring system of FIG. 13.

FIG. 13 is a schematic representation of a fifth embodiment of the present invention, wherein the invention is applied to a system for measuring the interval between a mask and a wafer in a semiconductor device manufacturing exposure apparatus. FIG. 14 is an enlarged schematic view, illustrating optical paths in the neighborhood of a first object (mask) and a second object (wafer) in FIG. 13.

In FIGS. 13 and 14, reference numeral 131 denotes light from a light source such as, for example, a He-Ne laser, a semiconductor laser or the like. A plate-like first object 1 is a mask, for example, and a plate-like second object 2 is a wafer, for example. The mask 1 and the wafer 2 are disposed opposed to each other, as illustrated, with a spacing $d_0$ for exposure (pattern transfer). Denoted at 134 and 135 are first and second wavefront converting elements provided in a portion of the mask 1 surface and comprising marks formed by grating patterns. These wavefront converting elements 134 and 135 each can be provided by a diffraction grating having no optical power, or a mark element having an optical power such as, for example, a Fresnel zone plate having a function of a lens. Denoted at 7 is a condensing lens having a focal length of $f_s$.

Denoted at 8 is a light receiving means (photodetector) disposed at the focal point position of the condensing lens 7. The light receiving means may comprise a line sensor, a PSD or the like and is adapted to detect the position of the gravity center of light incident thereupon. Signal processing circuit 115 operates to determine the position of the center of gravity of the light incident on the light receiving means 8 surface, by using an output signal from the light receiving means 8. Also, the signal processing circuit is operable to detect, by calculation, the spacing $d_0$ between the mask 1 and the wafer 2, to be described later in detail.

Denoted generally at 110 is an optical probe which includes the condensing lens 7 and the light receiving means (photodetector) 8 and, if desired, the signal processing circuit 115. The optical probe is movable relative to the mask 1 or the wafer 2. Reference numeral 111 denotes a wavelength monitor effective to detect the wavelength of light emitted by the light source LD.

In this embodiment, a semiconductor laser is used as the light source LD and an electric current to be injected thereto is controlled by using an injection current controlling means 117, such that while monitoring the emission wavelength from the semiconductor laser through the wavelength monitor 111, lights of different wavelengths are emitted in sequence from the light source LD. The light source LD and the injection current controlling means 17 are constituent elements of a light source unit 123.

Light 131 (center wavelength $\lambda=830$ nm) from the light source LD is perpendicularly incident on a point A on the surface of a first Fresnel zone plate (hereinafter simply "FZP") 134, on the mask 1 surface, within a plane parallel to the sheet of the drawing. Then, diffraction light of a predetermined order or orders, diffracted at an angle $\theta 1$ from the first FZP 134 is reflected at a point B (C) on the wafer 2 surface. When the mask and the wafer are placed at the spacing $d_0$, the light is reflected at the point B, and when they are placed at a spacing "$d_0+d_G$", the light is reflected at the point C. Of the reflection lights caused thereby, the reflection light 31 is one as obtainable when the wafer 2 is located at the position P1 (spacing $d_0$) close to the mask 1. The reflection light 32 is one which is obtainable when the wafer 2 is displaced by a distance $d_G$ from the position P1, namely, to the position P2.

Subsequently, the light 31 (32) reflected from the wafer 3 is incident on a point D (E) on the surface of a second Fresnel zone plate (hereinafter simply "FZP") 135 which is provided on the first object (mask) 1. The second FZP 135 has an optical function for changing the emission angle for the emitted diffraction light in accordance with the position of incidence of the light thereupon.

Diffraction light (61, 62) of a predetermined order or orders, diffracted at an angle $\theta 2$ from the second FZP 135 is directed through the condensing lens 7 to the surface of the light receiving means (photodetector) 8.

The spacing between the mask 1 and the wafer 2 can be detected by calculation, on the basis of detection of the position of incidence of the light (61, 62) upon the light receiving means 8 surface, by using the signal processing circuit 115. Thus, the position of the wafer 2 in the z-axis direction relative to the mask 1 can be detected.

Figure 15A:
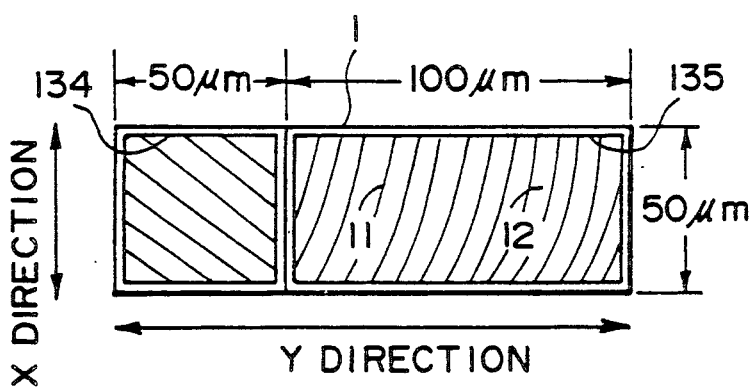
FIGS. 15A-15C are schematic representations, respectively, for illustrating and explaining grating patterns provided on a mask and optical functions of the grating patterns.
Figures 15B, 15C:
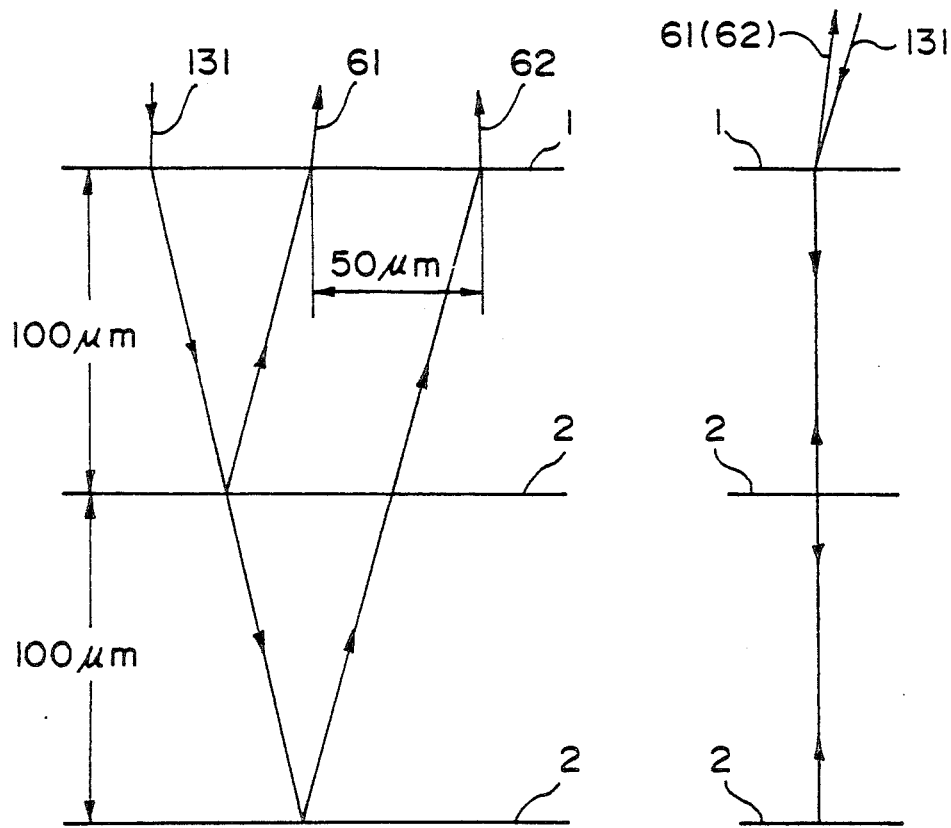

In this embodiment, in which the first and second Fresnel zone plates 134 and 135 are formed on the mask 1 each is provided by a grating pattern having a preset pitch, and the diffraction angles (emission angles) $\theta 1$ and $\theta 2$ of the diffraction lights of the predetermined order or orders (for example, ±first orders) incident on these plates are detected beforehand, with respect to the center wavelength $\lambda$ of the light 131. FIGS. 15A, 15B and 15C illustrate the function of each of the first and second FZP 134 and 135 of the mask 1 as well as the relationship of the lights (31, 32, 61 and 62) with the spacing of the mask and the wafer. Of these drawings, FIG. 15A is a plan view of the first and second FZP 134 and 135, FIG. 15B is an illustration of the lights passing through the first and second FZP 134 and 135, as viewed from the X direction, and FIG. 15C is similar to FIG. 15B but as viewed from the Y direction. Clearly each of these Fresnel zone plates can be considered as a mark.

In this embodiment, the first FZP 134 is equipped with a light deflecting function for bending the path of received light but, in addition to this, it may be equipped with a light converging or diverging function.

As seen from FIGS. 15A–15C, the second FZP 135 has such function that the direction of diffraction of the received light is changeable gradually with the position of incidence of the light inputted thereto. As an example, in FIG. 15A, the point 11 depicts the point of passage of the center of gravity of the emanating light from the FZP 135 where the spacing between the mask 1 and the wafer 2 is 100 microns. As the spacing between the mask 1 and the wafer 2 increases, the point of passage of the emanating light displaces rightwardly as viewed in FIG. 15A and, when the spacing becomes equal to 200 microns, the center of gravity of the emanating light passes through the point 12.

While the pattern of the FZP 135 has no optical power for light convergence or divergence, with respect to the Y direction, it may have such a power for adjustment of expansion of the light.

In this embodiment, with respect to the X direction, the FZP 135 has a light converging power (positive power) so that the light 61 (62) emanates in the direction of emission angle 5 degrees and is focused at the position of a distance $f_M=1000$ microns from the mask 1.

Where the range of measurement of the spacing between the mask 1 and the wafer 2 is set to be equal to 100–200 microns, for example, the size of each of the first and second Fresnel zone plates 134 and 135 may be determined correspondingly.

The manner of detecting the spacing between the mask 1 and the wafer 2 will now be explained, taken in conjunction with FIG. 13.

As shown in FIG. 13, where the distance to the mask 1 from the intersection F between the diffraction lights 61 and 62 is denoted by $f_M$, then $$AD = 2d_0\tan\theta 1, \tag{5}$$

$$AE = 2(d_0 + d_G)\tan\theta 1,$$

$$\therefore d_M = DE = AE - AD = 2d_G\tan\theta 1$$

Also, $$d_M = 2\cdot f_M\cdot\tan\theta 2 \tag{6}$$

The amount S of displacement of the incident light upon the light receiving surface of the photodetector 8 is given by:

$$S = 2 \cdot f_S \tan\theta 2 \quad (7)$$

Thus, it follows from equations (5), (7) and (8) that:

$$S = 2 \cdot d_G \cdot f_S / f_M \cdot \tan\theta 1 \quad (8)$$

In the present embodiment, as the light for detecting the spacing between the mask 1 and the wafer 2, plural lights having different wavelengths, for example, wavelengths λ1 and λ2 (λ1≠λ2) are supplied in sequence from the light source unit 123. This is effective produce, to the second FZP 135 on the mask 1 surface, two states (systems) which are different with respect to the effective focal length $f_M$. Then, the positions S1 and S2 of the lights of different wavelengths λ1 and λ2 incident on the light receiving surface of the photodetector 8 are detected and, from the difference S between these incident positions (S = S1−S2), the spacing between the mask 1 and the wafer 2 is determined.

Assuming now that the focal length of the second FZP 135 of the mask 1 at a wavelength λ is denoted by f, that the spacing between the mask 1 and the wafer 2 is denoted by g, and that the distance from the wafer 2 to the intersection F is denoted by a, then the following relation is provided:

$$a = f \div g$$

Therefore, the magnification A of the displacement of the gravity center position of the light, of the wavelength λ, upon the light receiving surface 9, to a change $d_G$ in the spacing, can be expressed by:
$A = f_S / f_M \cdot d_G \tan\theta$ Next, if the wavelength is denoted by λ and the radius of each ring of the grating pattern of the mark 135 is denoted by $r_m$ (where m is the ordinal number of the ring), then, the following relationship is provided with respect to the focal length f:

$$\sqrt{r_m^2 + f^2} - f = m\lambda$$

From this, the focal length f can be expressed by:

$$f = [r_m^2 - (m\lambda)^2] \tfrac{1}{2} m\lambda$$

If the wavelength of the light changes by Δλ, then a resultant focal length f' is given by:

$$f' = [r_m^2 - m^2(\lambda + \Delta\lambda)^2]/2m(\lambda + \Delta\lambda)]$$

Namely, where the focal length of the second FZP 135 with respect to light of a wavelength λ1 is denoted by $f_{M1}$ and the focal length of the same FZP 135 with respect to light of another wavelength λ2 is denoted by $f_{M2}$, then the following relation is provided:

$$S = d_G \cdot f_S \cdot [\tan\theta 1(\lambda 1)/f_{M1} - \tan\theta 1(\lambda 2)/f_{M2}] \quad (9)$$

where $f_{M1} \neq f_{M2}$
Strictly, however, $$S = d_G \cdot [f_{S1}/f_{M1} \times \tan\theta 1(\lambda 1) - f_{S2}/f_{M2} \times \tan\theta 1(\lambda 2)] \quad (10)$$

wherein $f_{S1}$ and $f_{S2}$ are the effective focal lengths of the condensing lens 7 with respect to the lights of the wavelengths λ1 and λ2.

If the difference between the two wavelengths λ1 and λ2 is large, for example, if there is a difference not less than SP≧2.0D, the spacing detection is attainable even by simultaneously irradiating the lights of the wavelengths λ1 and λ2. Where the difference in wavelength is small, for example, where there is a difference not greater than SP<2.0D, desirably these lights may be projected in sequence. Here, D denotes a larger one of the spot diameters of the lights of the wavelengths λ1 and λ2, upon the light receiving surface of the photodetector.

In this embodiment, while monitoring the wavelength of the light 131 through the wavelength monitor 101, the emission wavelength of the light source SL is modulated by 10 % by changing the injection current of the light source LD through the injection current controlling means 17. Namely, λ2 = 1.1×λ1(λ1=0.830 micron). Here, in this embodiment, the FZP 135 is no formed to provide $f_{M1}$ = 214.723 microns and $f_{M2}$ = 195.124 microns.

First, in FIG. 15A, the grating pitch $P_A$ in the Y direction of the first FZP 135 which is at the light input side is set so that $P_A$ = 1.66 micron so as to satisfy $\tan\theta 1(\lambda 1) = 0.577$ (where $\theta(\lambda 1) = 30$ degrees). Here, if $\tan\theta 1(\lambda 2) = 0.659$ (where $\theta 1(\lambda 2) = 33.37$ degrees) and $f_{S1} \div f_{S2} = 30.0$ mm, then the quantity S of the change in the position of incidence of the light upon the light receiving means 8 surface, when the lights of the wavelengths 1 and 2 are caused to pass the first PZP 134, the wafer 2 and the second FZP 135 in this order, can be given by:

$$S = 20.704 d_G$$

Thus, for each change of 1 micron in the gap between the mask 1 and the wafer 2, the light (spot) on the light receiving means 8 surface displaces by 15 microns. When a PSD having a position resolution of 0.3 micron is used as the light receiving means 8, in principle, the gap between the mask 1 and the wafer 2 can be measured with the resolution not greater than 0.02 micron.

Accordingly, where the grating pattern of each of the first and second marks 134 and 135 of the mask and the wafer are so designed that the position of the center of gravity of the light upon the light receiving means 8 surface does not shift even if the wavelength of the light 131 is changed when the mask and the wafer are held at a correct gap in the Z direction, then the difference (i.e. Δδ') between the positions of the lights of the wavelengths λ1 and λ2 incident on the light receiving surface of the photodetector 8 is proportional to the quantity Δσ of change in the gap between the mask and the wafer. Therefore, by detecting the magnitude Δδ from the output signal of the photodetector 8, it is possible to detect the quantity Δσ of change in the gap between the mask and the wafer. Further, the direction of displacement of the position of the light upon the light receiving surface of the photodetector 8 as the wavelength is changed by Δλ, corresponds to the positiveness or negativeness of the direction of the change in the gap between the mask and the wafer. Therefore, by detecting such a corresponding relationship beforehand, it is also possible to detect the direction of the change in the gap, from the direction of displacement of the position of incidence of the light as the wavelength is changed.

Here, it is not always necessary that the magnitude $\Delta\delta'$ when $\Delta\delta=0$ is equal to 0 (zero). If the absolute value of $\Delta\delta'$ when $\Delta\delta=0$ as well as the direction of displacement of the position of incidence of the light as the wavelength is changed, are detected beforehand, then it is possible to determine the spacing between the mask 1 and the wafer 2 on the basis of a difference between the magnitude $\Delta\epsilon'$ as provided when $\Delta\sigma=0$ and the magnitude $\Delta\epsilon'$ at the time of spacing detection.

The spacing between a mask 1 and a wafer 2 can be set in various ways. In a first method the equation regarding the relationship of the displacement $\Delta\delta'$ of the position of incidence of the light 131 upon the light receiving surface of the photodetector 8 at the time of wavelength change, to the quantity $\Delta\sigma$ of change in the gap between the mask and the wafer, is detected beforehand and is stored in a memory of the signal processing circuit 115. At the time of actual gap detection, two lights of two predetermined wavelengths are supplied in sequence from the light source LD, and the positions of incidence of the respective lights having different wavelengths are detected by the signal processing circuit 115 on the basis of the output signals from the photodetector 8. Then, the displacement $\delta'$ of the position of incidence of the light is calculated and, from the detected value $\delta\sigma'$, the quantity $\delta\sigma$ of change in the spacing between the mask and the wafer is determined. Then, the mask or the wafer is moved in the Z direction by an amount corresponding to the detected quantity $\Delta\sigma$, this being made by driving a stage which carried thereon the mask or the wafer.

Figures 17A, 17B:
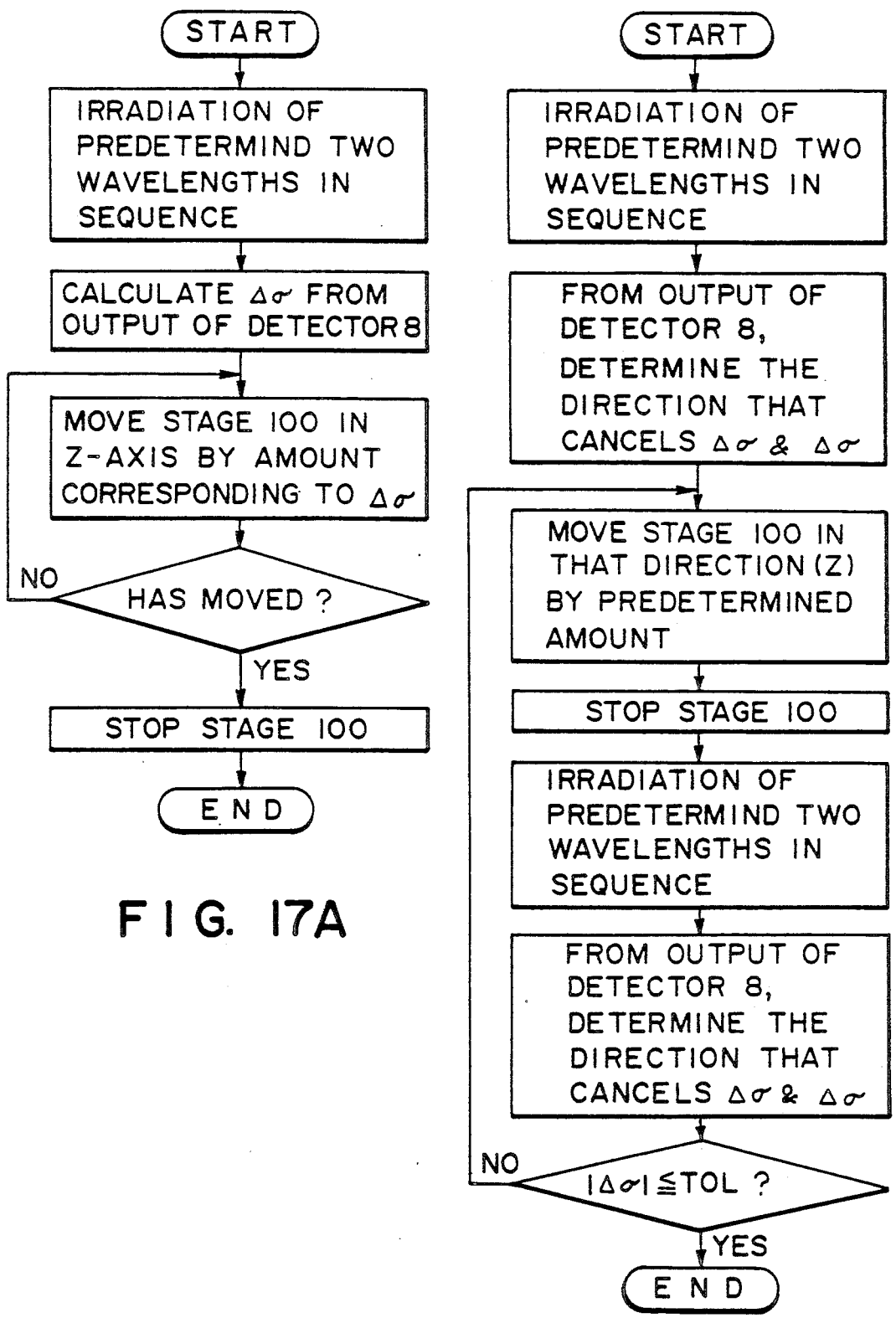
FIGS. 17A and 17B are flow charts, respectively, each illustrating an example of interval adjusting sequence to be made in the interval measuring system of FIG. 13.

In a second method at the time of spacing detection, lights of two predetermined wavelengths are supplied in sequence from the light source LD and the magnitude $\delta\sigma$ is detected from the position of incidence of the light as obtainable on the basis of the output signal of the photodetector 8. From this, the direction that cancels the error $\Delta\sigma$ is detected and, in the detected direction, the mask or wafer is moved along the z-axis by an amount corresponding to $\Delta\delta'$, this being made by driving a stage which carried thereon the mask or the wafer. As the movement is finished, lights of two predetermined wavelengths are supplied again, in sequence, from the light source LD, and the above-described detection and movement are repeated until the magnitude $\Delta\sigma$ is reduced into a tolerable range. The above-described sequences of spacing adjustment are illustrated in the flow charts of FIGS. 17A and 17B.

In the present embodiment, as a method of determining the position of incidence of the light upon the light receiving surface of the photodetector 8, there is the center of method in which the position of a gravity of light (intensity distribution thereof) upon the light receiving surface or the position of a peak of the intensity on that surface is detected on the basis of the output signal of the photodetector 8.

In the present embodiment, as described hereinbefore, it is not necessary to set a specific reference point on the light receiving surface of the photodetector, for the spacing detection. In other words, it is not necessary to determine the position of incidence of the light upon the light receiving surface to be assumed when $\Delta\sigma=0$. Only by modulating or shifting the emission wavelength of the light source LD, it is possible to detect a gap change.

Further, even if a wafer 2 is inclined, the displacement of the position of incidence of the light upon the light receiving surface of the photodetector resulting from such inclination, does not change with a change in the emission wavelength of the light source LD. Therefore, the magnitude $\Delta\delta'$ is unchanged. This is also the case with any change in the position of the light projecting means (111, 123) or the detecting means (110) in the X or Y direction. As a result, on the basis of detection of $\Delta\delta'$, it is possible to detect the gap change without being influenced by any inclination of the wafer or a change in the position of the light projecting means or the detector.

In the present embodiment, a semiconductor laser is used as the light source LD and, by controlling an injection current to the laser, the emission wavelength is modulated. As a result, only detection of a change in the position of incidence of one light beam can assure detection of an absolute value of a change in the spacing. Accordingly, the present embodiment is more effective than an arrangement wherein two lights of different wavelengths are supplied from separate light sources.

In this embodiment, the diffraction light from the second FZP 135, for one particular position of the wafer 2 with respect to the Z direction, is incident on the condensing lens 7 at a particular angle with respect to the optical axis 63. Also, the light receiving means 8 is set at the focal point position of the condensing lens 7. Therefore, the position of incidence of the light upon the light receiving means 8 surface is substantially unchangeable, regardless of which position on the optical axis 63 the optical probe 110 is disposed at and, additionally, even if it is slightly deviated in a direction perpendicular to the optical axis. By this, any measurement error due to the displacement of the optical probe itself can be suppressed.

It is to be noted here that, in the case where the positional error of the optical probe 110 to some extent is permissible, it is not necessary to dispose the light receiving means 8 exactly at the focal point position of the condensing lens 7.

Figure 16A:
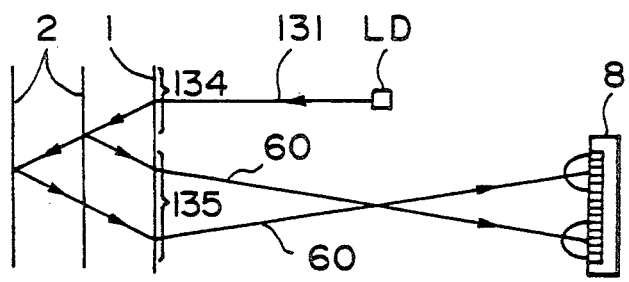
FIGS. 16A and 16B are schematic representations, respectively, illustrating a sixth embodiment of the present invention.
Figure 16B:
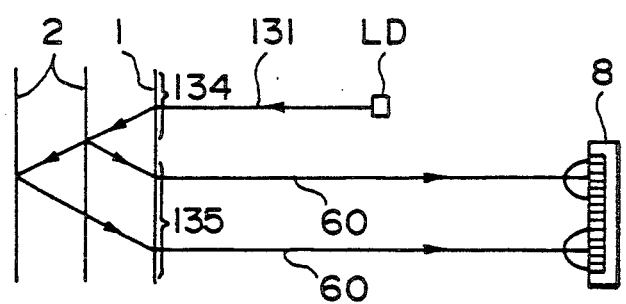

The condensing lens 7 of the FIG. 13 embodiment may be omitted such as illustrated in FIGS. 16A and 16B (sixth embodiment). While the diameter of light incident on the photodetector 8 is slightly larger as compared with the FIG. 13 embodiment, the objects of the present invention can be accomplished.

FIG. 16A is a schematic view of an embodiment wherein the condensing lens 7 of the FIG. 13 embodiment is omitted.

FIG. 16B shows an embodiment wherein a Fresnel zone plate (mark) 5 of a mask 1, in the FIG. 16A embodiment, is replaced by a pattern having a function for emitting a received light in a determined direction but not having a light converging or diverging function (i.e. optical power). More specifically, as the Fresnel zone plate 5, a diffraction pattern comprising a rectilinear diffraction grating having linear patterns arrayed at a regular pitch in parallel to each other, is used. Also in this case, like the embodiment of FIG. 16A, the objects of the present invention can be accomplished.

In the embodiment shown in FIG. 16B, the Fresnel zone plate (diffraction grating) 5 may be omitted so that the light reflected by the wafer 2 simply passes the mask 1, without being diffracted. The photodetector 8 may be disposed so as to receive such transmitted light.

Further, in FIGS. 16A and 16B, the Fresnel zone plate (diffraction grating or mark) 4 of the mask 1, at the light input side, may be omitted and the light from the light source LD is projected with inclination with respect to a normal (Z direction) to the mask 1 surface even before it is inputted to the mask 1.

Further, in FIGS. 16A and 16B, a diffraction grating may be provided on the wafer, such that the diffraction light from the Fresnel zone plate (diffraction grating) 134 may be reflectively diffracted by the diffraction grating of the wafer and directed to the Fresnel zone plate (mark) 135.

Figure 18:
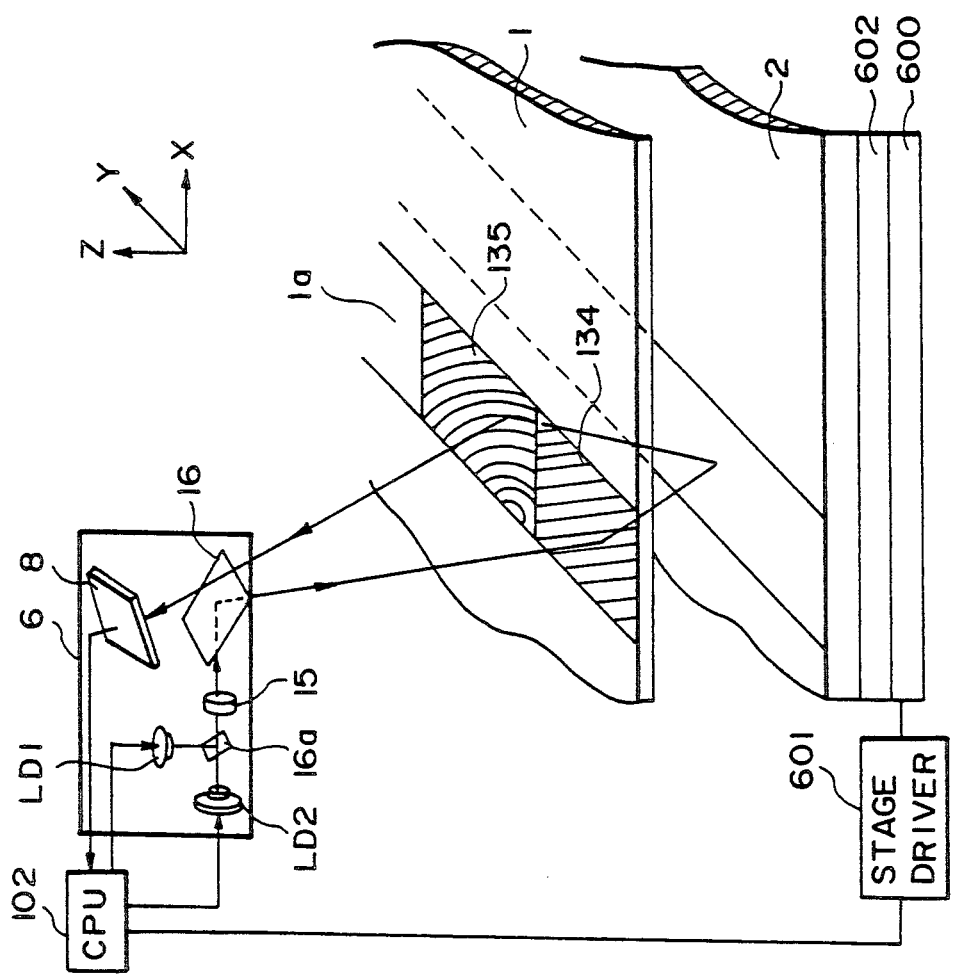
FIGS. 18 and 19 are schematic representations, respectively, illustrating interval adjusting systems arranged in accordance with seventh and eighth embodiments of the present invention.

FIG. 18 is a schematic representation of an interval measuring system according to a seventh embodiment of the present invention, which is incorporated into a semiconductor device manufacturing exposure apparatus. Elements similar to those of FIG. 13 are assigned to corresponding numerals. While major constituent elements are the same as those of the fifth embodiment shown in FIG. 13, in the present embodiment two semiconductor lasers LD1 and LD2 whose emission (center) wavelengths are different from each other are provided in the alignment head 6 as a light source means. The optical path adjustment is such that the chief ray of the lights from the semiconductor lasers LD1 and LD2 are superposed one upon another as the lights emanate from a half mirror 16a. Reference numeral 600 denotes an X-Y-Z stage which can be driven in the X, Y and Z directions by means of a stage driver 601. Reference numeral 602 denotes a wafer chuck for holding a wafer 2 by attraction.

CPU 102 is operable to selectively or alternately energize the semiconductor lasers LD1 and LD2, for the wavelength changing as described with reference to the preceding embodiment. More specifically, the CPU is operable to alternately energize these lasers (although the lasers may be energized at the same time) to thereby change the wavelength of light impinging on a mark 134. Alternatively, a shutter may be provided in front of the semiconductor lasers LD1 and LD2, respectively, and these shutters may be alternately opened/closed under the control of the CPU 102. The semiconductor laser LD1 has a center wavelength of 830 nm and the semiconductor laser LD2 has a center wavelength of 780 nm. As regards the design equations of the grating patterns of the mask 134 and 135, the parameter setting was made on an assumption that light of a wavelength 805 nm was used. The wavelength modulation rate in this occasion is $\Delta\lambda/\lambda = 6.2 \times 10^{-2}$.

Assuming now that the grating mark 135 of the mask 1 has a focal length f, that the spacing between the mask and the wafer is equal to g like the fifth embodiment, and that, to the light of a wavelength 805 nm, the gap detecting magnification A of the grating lens system is 80.6, then the magnitude $\Delta A$ of the magnification change is equal to 5.33.

Figure 19:
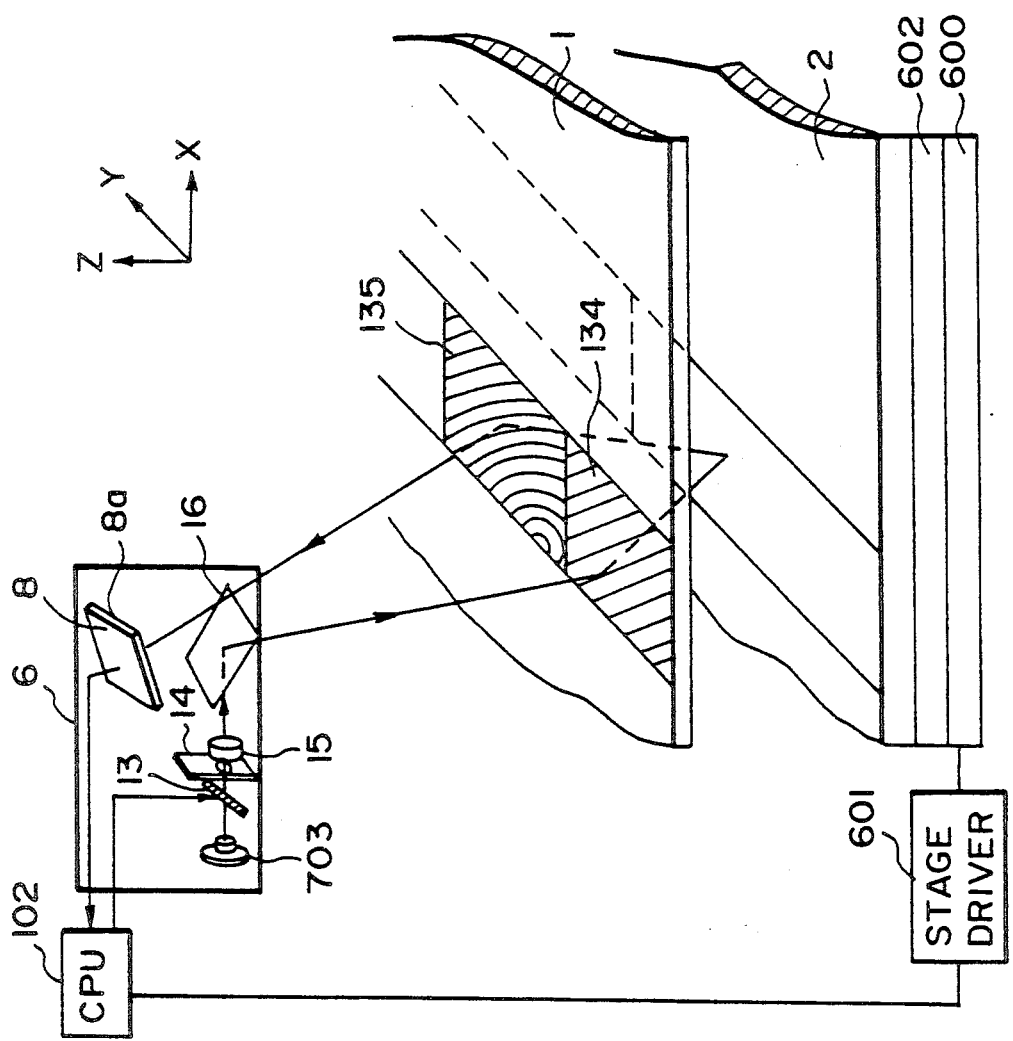

FIG. 19 is a schematic representation of an interval measuring system according to an eighth embodiment of the present invention, which is incorporated into a semiconductor device manufacturing exposure apparatus. In this embodiment, a white light source 703 is used as a light source means, and the diffraction grating 13 and a slit plate 14 are provided in an alignment head 6 as the wavelength selecting means. The diffraction grating 13 is disposed with inclination with respect to the light inputted thereto and is adapted to change the angle of inclination thereof. Since the diffraction rays of different wavelengths have different emission angles when they emanate from the diffraction grating 13, by disposing the slit plate 14 with an opening such as a slit or pinhole of a predetermined size, at a predetermined position to be irradiated with the diffraction light and by rotationally moving the diffraction grating 13 so as to change the angle of inclination thereof, it is possible to change the wavelength of light passing through the opening of the slit plate 14, such as a slit or a pinhole. Accordingly, at the time of wavelength change as has been described with reference to the preceding embodiment, the CPU 102 operates to rotationally move the diffraction grating 13 by a predetermined angle to shift the wavelength of the light irradiating the marks 134 and 135.

Where a light source of low coherency is used, such as in the present embodiment, it is possible to suppress unwanted light such as speckle on the light receiving surface 8a of the photodetector 8, resulting from scattered light from the surface of a resist on a wafer 2 or from edges of marks 134 and 135 of the mask.

The element of the wavelength selecting means is not limited to a diffraction grating. For example, a prism, an etalon, a color filter or the like may be used. Also, the wavelength selecting means may be disposed just before the light receiving surface 8a of the photodetector 8, not just after the light source 703, such that a white light is projected to a grating lens and only a light component of a particular wavelength to be detected, of the light diffracted by the grating lens 134 or 135, may be extracted by the wavelength selecting means and directed to the light receiving surface 8a.

In that case, the size of the opening of the slit plate 14, such as a slit or a pinhole, may be so set that, even if the angle of emission of the light from the mark 135 changes with a change in the spacing between the mask and the wafer, light of a wavelength to be detected is not blocked as long as the spacing between the mask and the wafer are in a certain error range.

In the first to eighth embodiments of the present invention as described hereinbefore, lights of different wavelengths are projected in sequence to a mark formed by a grating pattern or a pattern having a lens function. However, this is only for exemplification and, as described hereinbefore, lights of different wavelengths may be projected to the mark at the same time and the lights from the mark may be detected at the same time by a sensor such as a photodetector In such occasion, a dichroic mirror may be suitably used to separate the lights, such as diffraction lights, of different wavelengths from the mark, with respect to the wavelength, such that the lights of different wavelengths can be received by separate photodetectors, respectively.

Further, the foregoing embodiments have been described with reference to a position detecting system or a spacing measuring system for use in an X-ray exposure apparatus. However, the invention is applicable also to an exposure apparatus that uses light of g-line, i-line or a laser beam.

Figure 1:
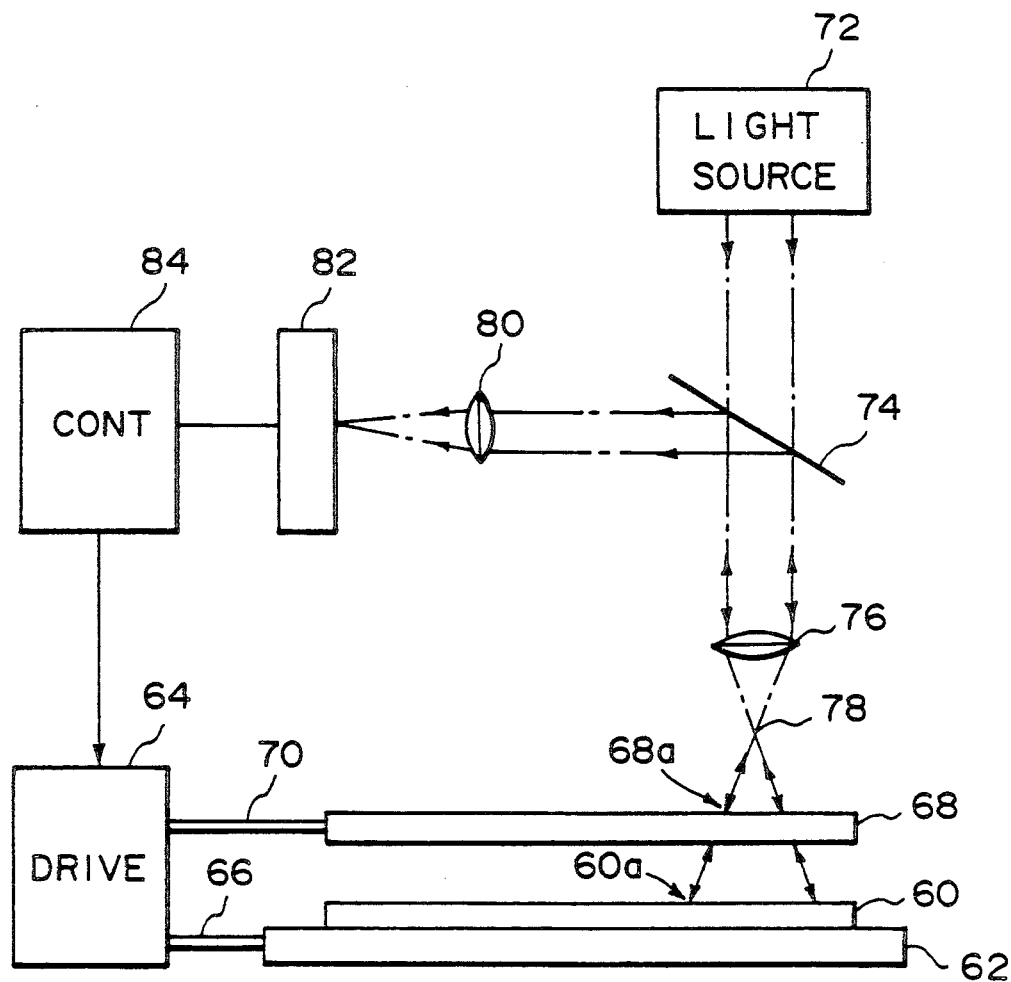
FIGS. 1-3 are schematic representations, respectively, illustrating an example of known type position detecting system.
Figure 2:
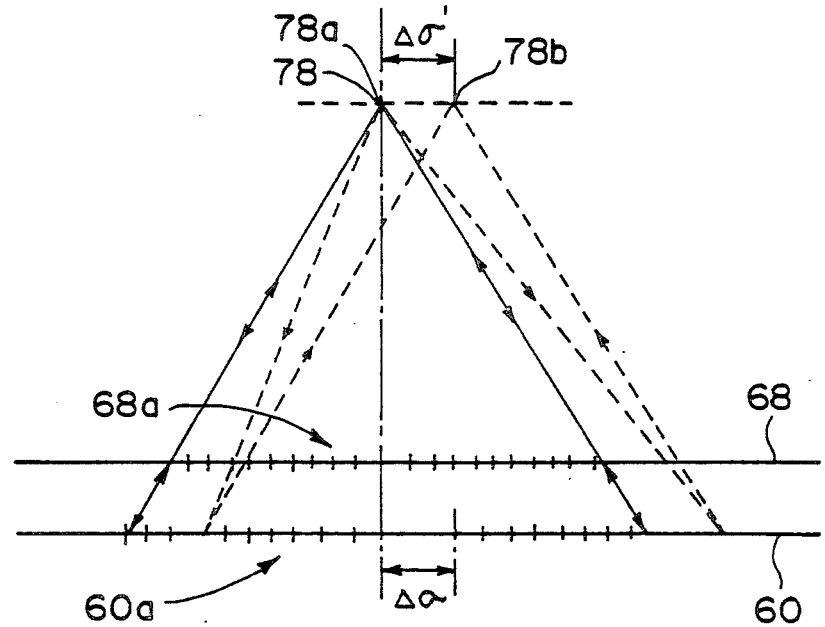
Figure 3:
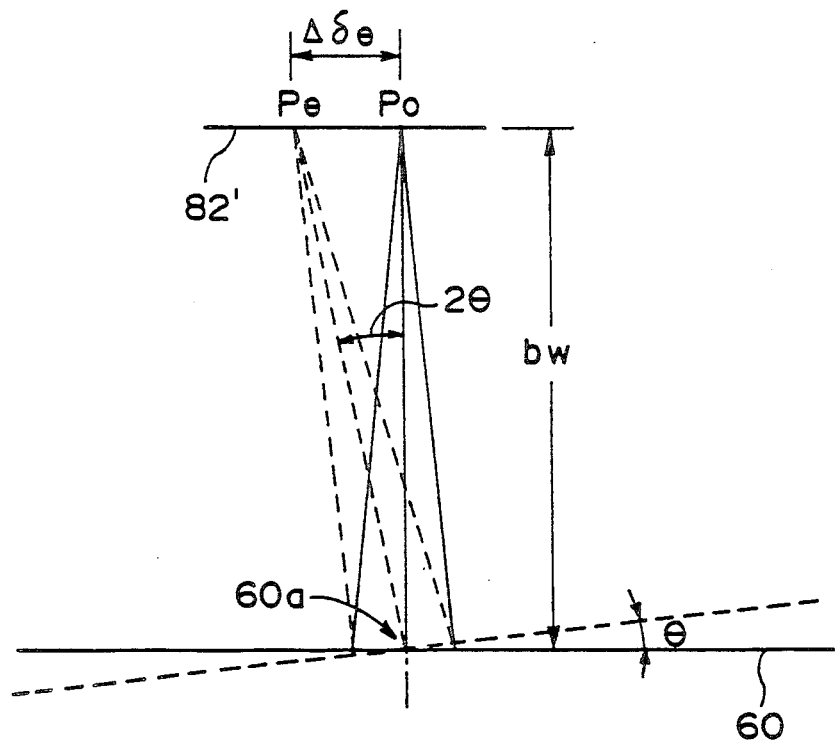

Also, the present invention is not limited to the disclosed type of position detecting system and, for example, the invention is applicable to a position detecting system of the type such as explained with reference to FIG. 1.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method for detecting the position of a substrate by use of a mark provided on the substrate and having an optical power dependent upon wavelength, said method comprising the steps of:

irradiating the mark with first and second radiation beams having different wavelengths; and receiving the first and second radiation beams from the mark by use of a sensor to determine the position of the substrate on the basis of the position of incidence of each of the first and second radiation beams on the sensor.

2. A method according to claim 1, wherein the position of the substrate with respect to a direction substantially perpendicular to the surface of the substrate is detected.

3. A method according to claim 1, wherein the position of the substrate with respect to a direction substantially parallel to the surface of the substrate is detected.

4. A method according to claim 2 or 3, wherein the position of incidence of each of the first and second radiation beams upon the sensor is determined on the basis of the position of a gravity center of an intensity distribution of each radiation beam upon a light receiving surface of the sensor.

5. A method according to claim 2 or 3, wherein the position of incidence of each of the first and second radiation beams upon the sensor is determined on the basis of the position of a peak of an intensity distribution of each radiation beam upon a light receiving surface of the sensor.

6. A method according to claim 1, wherein the mark comprises a Fresnel zone plate.

7. A method according to claim 6, wherein the mark is adapted to diffract the first and second radiation beams so that they are converged at predetermined positions, respectively.

8. A method according to claim 1, wherein the first and second radiation beams are projected in sequence to the grating pattern.

9. A method according to claim 1, wherein the first and second radiation beams are projected to the grating pattern simultaneously.

10. A method according to claim 8 or 9, wherein the first and second radiation beams are received by the sensor in sequence.

11. A method according to claim 9, wherein the first and second radiation beams are received by first and second, separate sensors, independently of each other.

12. A method of detecting the relative position of first and second substrates by use of a first mark with an optical power, provided on the first substrate and having wavelength dependence, and a second mark with an optical power, provided on the second substrate and having wavelength dependence, said method comprising the steps of:

projecting first and second radiation beams having different wavelengths through the first mark to the second mark; and receiving the first and second radiation beams from the second mark by use of a sensor to determine the relative position of the first and second substrates on the basis of the position of incidence of each of the first and second radiation beams on the sensor.

13. A method according to claim 12, wherein the first substrate is a mask having an integrated circuit pattern formed thereon, and wherein the second substrate is a semiconductor wafer.

14. A method according to claim 12, wherein the first substrate is a semiconductor wafer and the second substrate is a mask having an integrated circuit pattern formed thereon.

15. A method according to claim 12, wherein the first mark has a positive power and the second mark has a negative power.

16. A method according to claim 12, wherein the first mark has a negative power and the second mark has a positive power.

17. A method according to claim 12, wherein each of the first and second marks has a positive power.

18. A method according to claim 12, wherein the first and second radiation beams are projection to sequence to the first mark.

19. A method according to claim 12, wherein the first and second radiation beams are projected to the first mark simultaneously.

20. A method according to claim 18 or 19, wherein the first and second diffraction beams are received by the sensor in sequence.

21. A method according to claim 19, wherein the first and second diffraction beams are received by first and second, separate sensors, independently of each other.

22. A method according to claim 12, wherein each of the first and second marks is provided by a grating pattern.

23. A method according to claim 22, wherein the diffraction pattern comprises a Fresnel zone plate.

24. A method according to claim 12, wherein the position of incidence of each of the first and second diffraction beams upon the sensor is determined on the basis of the position of a gravity center of an intensity distribution of each diffraction beam upon a light receiving surface of the sensor.

25. A method according to claim 12, wherein the position of incidence of each of the first and second diffraction beams upon the sensor is determined on the basis of the position of a peak of an intensity distribution of each diffraction beam upon a light receiving surface of the sensor.

26. A method of detecting the relative position of first and second substrates in a direction substantially perpendicular to the surface of the first or second substrate, by use of a grating pattern provided on the first substrate, said method comprising the steps of:

irradiating the grating pattern with first and second radiation beams having different wavelengths to produce first and second diffraction beams of different wavelengths so that the first and second diffraction beams are projected onto the second substrate obliquely; and receiving the first and second diffraction beams reflected from the second substrate by use of a sensor to determine the relative position of the first and second substrates on the basis of the position of incidence of each of the first and second diffraction beams on the sensor.

27. A method according to claim 26, wherein the position of incidence of each of the first and second diffraction beams upon the sensor is determined on the basis of the position of a gravity center of an intensity distribution of each diffraction beam upon a light receiving surface of the sensor.

28. A method according to claim 26, wherein the position of incidence of each of the first and second diffraction beams upon the sensor is determined on the basis of the position of a peak of an intensity distribution of each diffraction beam upon a light receiving surface of the sensor.

29. A method according to claim 26, wherein the first substrate is provided with an auxiliary grating pattern, different from the first mentioned grating pattern, and wherein the first and second diffraction beams reflected by the second substrate are diffracted again by the auxiliary grating pattern and are directed to the sensor.

30. A method according to claim 29, wherein the auxiliary grating pattern has an optical power.

31. A method according to claim 30, wherein the auxiliary grating pattern comprises a Fresnel zone plate.

32. A method according to claim 30, wherein the second substrate is provided with a grating pattern and wherein the first and second diffraction beams are directed to the grating pattern of the second substrate.

33. A method according to claim 26, wherein the first and second radiation beams are projected in sequence to the grating pattern.

34. A method according to claim 26, wherein the first and second radiation beams are projected to the grating pattern simultaneously.

35. A method according to claim 33 or 34, wherein the first and second diffraction beams are received by the sensor in sequence.

36. A method according to claim 36, wherein the first and second diffraction beams are received by first and second, separate sensors, independently of each other.

37. A method of detecting the relative position of first and second substrates in a direction substantially perpendicular to the surface of the first or second substrate, by use of a pattern with an optical power, provided on the first substrate and having wavelength dependence, said method comprising the steps of:
projecting first and second radiation beams having different wavelengths obliquely to the second substrate; and
receiving, through the pattern and by use of a sensor, the first and second radiation beams reflected by the second substrate to determine the relative position of the first and second substrates on the basis of the position of incidence of each of the first and second diffraction beams on the sensor.

38. A method according to claim 37, wherein the position of incidence of each of the first and second radiation beams on the sensor is determined on the basis of the position of a gravity center of an intensity distribution of each radiation beam on a light receiving surface of the sensor.

39. A method according to claim 39, wherein the position of incidence of each of the first and second radiation beams on the sensor is determined on the basis of the position of a peak of an intensity distribution of each radiation beam on a light receiving surface of the sensor.

40. A method according to claim 37, wherein the pattern is provided by a grating pattern.

41. A method according to claim 40, wherein the grating pattern comprises a Fresnel zone plate.

42. A method according to claim 37, wherein the first and second radiation beams are projected in sequence to the grating pattern.

43. A method according to claim 37, wherein the first and second radiation beams are projected to the grating pattern simultaneously.

44. A method according to claim 42 or 43, wherein the first and second diffraction beams are received by the sensor in sequence.

45. A method according to claim 43, wherein the first and second diffraction beams are received by first and second, separate sensors, independently of each other.

46. An exposure apparatus for exposing a wafer having an alignment mark with an optical power dependent upon wavelength, said apparatus comprising:
a movable stage for carrying the wafer thereon;
driving means for moving said stage for alignment of the wafer;
projecting means for projecting first and second beams having different wavelengths to the alignment mark of the wafer;
detecting means having a detection surface of receiving first and second beam patterns of different wavelengths produced by reflection of the first and second means by the alignment mark of the wafer, and for producing first and second signals corresponding to positions of the first and second beam patterns, respectively, on said detection surface; and
control means for detecting a deviation in positional relationship of the first and second beam patterns from a predetermined positional relationship by using the first and second signals, and for producing and applying a correction signal, corresponding to the detected deviation, to said driving means for alignment of the wafer.

47. An apparatus according to claim 46, further comprising supporting means for supporting a mask having an alignment pattern with an optical power dependent upon wavelength, wherein said projecting means projects the first and second beams to the alignment pattern of the mask and then to the alignment mark of the wafer, and wherein said control means produces and applies a correction signal to said driving means for alignment of the mask and the wafer.

48. An exposure apparatus for exposing a wafer to a mask having a pattern with an optical power dependent upon wavelength, said apparatus comprising:
a movable stage for carrying the wafer thereon;
driving means for moving said stage for alignment of a surface of the wafer;
projecting means for projecting first and second beams having different wavelengths obliquely to the surface of the wafer, such that first and second reflection beams are produced by reflection by the surface of the wafer;
detecting means having a detection surface for receiving first and second beam patterns of different wavelengths produced by deflection of the first and second reflection beams by the pattern of the mask, and for producing first and second signals corresponding to positions of the first and second beam patterns, respectively on said detection surface; and
control means for detecting a deviation in position relationship of the first and second beam patterns from a predetermined positional relationship by using the first and second signals, and for producing and applying a correction signal, corresponding to the detected deviation, to said driving means for alignment of the surface of the wafer;

49. A semiconductor device manufacturing method for aligning a wafer having a mark with an optical power dependent upon wavelength by using the mark and for printing a circuit pattern on the thus aligned wafer, comprising the steps of:

projecting first and second beams having different wavelengths to the mark of the wafer, whereby first and second beam patterns are produced by the first and second beams from the mark, on a predetermined plane;

detecting a positional relationship between the first and second beam pattern on the predetermined plane; and aligning the wafer on the basis of the detected positional relationship.

50. A method according to claim 49, wherein the mark of the wafer is formed by a zone plate pattern.

51. A semiconductor device manufacturing method for aligning a surface of a wafer by using a matrix pattern of a mask having an optical power dependent upon wavelength and for printing a circuit pattern of the mask on the thus aligned wafer, comprising the steps of:

projecting first and second beams having different wavelengths obliquely to the surface of the wafer, such that the first and second beams are reflected by the surface of the wafer and then are deflected by the mark pattern of the mask, whereby first and second beam patterns are formed on a predetermined plane;

detecting a positional relationship between the first and second beam pattern on the predetermined plane; and aligning the surface of the wafer on the basis of the detected positional relationship.

52. A method according to claim 51, wherein the mark pattern of the mask is formed by a zone plate pattern.

* * * * *

UNITED STATES PATENT AND TRADEMARK OFFICE
CERTIFICATE OF CORRECTION

PATENT NO. :   5,114,236
DATED      :   May 19, 1992
INVENTOR(S):   Matsugu et al.

It is certified that error appears in the above-identified patent and that said Letters Patent is hereby corrected as shown below:

Title Page:
[56] REFERENCES CITED:

"Miztani et al." should read --Mizutani et al.--.

COLUMN 2:

Line 50, "$\theta \div 10^{-4}$(rad)     (i)" should read --$\theta \doteq 10^{-4}$(rad)     (i)--.

COLUMN 4:

Line 40, "gravity center" should read --center of gravity--;

Line 49, "gravity center" should read --center of gravity--.

COLUMN 6:

Line 24, "denoted and" should read --and denoted--;

UNITED STATES PATENT AND TRADEMARK OFFICE
CERTIFICATE OF CORRECTION

PATENT NO.  : 5,114,236
DATED       : May 19, 1992
INVENTOR(S) : Matsugu et al.

It is certified that error appears in the above-identified patent and that said Letters Patent is hereby corrected as shown below:

Line 42, "and at" should read --and denoted at--;

Line 52, "z direction" should read --Z direction--.

COLUMN 7:

Line 19, "operate" should read --operates--.

COLUMN 8:

Line 23, "by ," should read --by a,--.

COLUMN 9:

Line 30, "$\Delta A-0.86 \times \Delta\lambda/\lambda \times (A-1)$" should read --$\Delta A=0.86 \times \Delta\lambda/\lambda \times (A-1)$--;

Line 33, "$\Delta\lambda/\lambda=0.1$," should read --If $\Delta\lambda/\lambda=0.1$,--;

Line 50, "position gravity" should read --position of the center of gravity--;

Line 60, "magnitude $\Delta\sigma'$" should read --magnitude $\Delta\delta'$--.

COLUMN 10:

Line 7, "$\delta\sigma'$" should read --$\Delta\delta'$--;

Line 8, "$\Delta\sigma'$" should read --$\Delta\delta'$--;

UNITED STATES PATENT AND TRADEMARK OFFICE
CERTIFICATE OF CORRECTION

PATENT NO. : 5,114,236  Page 3 of 8
DATED : May 19, 1992
INVENTOR(S) : Matsugu et al.

It is certified that error appears in the above-identified patent and that said Letters Patent is hereby corrected as shown below:

Line 15, "magnitude $\Delta\sigma'$" should read --magnitude $\Delta\delta'$--;

Line 19, "of the" (third occurrence) should read --of gravity of the--;

Line 31, "$\Delta\sigma'$" should read --$\Delta\delta'$--;

Line 53, "into" should read --to--.

COLUMN 11:

Line 29, "diffraction" should read --diffracted--.

COLUMN 12:

Line 35, "an occasion" should read --a case--;

Line 38, "suming," should read --suming--.

COLUMN 13:

Line 21, "water" should read --wafer--;

Line 33, "water" should read --wafer--;

Line 36, "water" should read --wafer--.

COLUMN 14:

Line 3, "description" should read --a description--;

Line 16, "length" should read --length of--.

UNITED STATES PATENT AND TRADEMARK OFFICE
CERTIFICATE OF CORRECTION

PATENT NO. : 5,114,236
DATED : May 19, 1992
INVENTOR(S) : Matsugu et al.

It is certified that error appears in the above-identified patent and that said Letters Patent is hereby corrected as shown below:

COLUMN 15:

Line 7, "gravity center position" should read --position of the center of gravity--;

Line 19, "$\Delta\sigma=\Delta\sigma'/\Delta A$ (3)" should read --$\Delta\sigma=\Delta\delta'/\Delta A$ (3)--;

Line 63, "energize" should read --energizes--.

COLUMN 16:

Line 14, "wavelength 805nm," should read --wavelength of 805nm,--;

Line 32, "diffracting grating 13," should read --diffraction grating 13,--.

COLUMN 18:

Line 43, "defected" should read --detected--.

COLUMN 19:

Line 30, "means 17" should read --means 117--;

Line 51, "wafer 3" should read --wafer 2--.

COLUMN 20:

Line 3, "1 each" should read --1, each--.

UNITED STATES PATENT AND TRADEMARK OFFICE
CERTIFICATE OF CORRECTION

PATENT NO. : 5,114,236  
DATED : May 19, 1992  
INVENTOR(S) : Matsugu et al.

It is certified that error appears in the above-identified patent and that said Letters Patent is hereby corrected as shown below:

COLUMN 21:

Line 7, "(7) and (8)" should read --(6) and (7)--;

Line 15, "effective" should read --effective to--;

Line 38, "$A=f_s/f_M \cdot d_G \tan\theta$" should read --$A=f_s/f_M \cdot d_G \cdot \tan\theta$--;

Line 51, "$f=[r_m^2-(m\lambda)^2]\tfrac{1}{2}m\lambda$" should read --$f=[r_m^2-(m\lambda)^2]2m\lambda$--;

Line 56, "$f'=[r_m^2-m^2(\lambda+\Delta\lambda)^2]/2m(\lambda+\Delta\lambda)$" should read --$f'=[r_m^2-m^2(\lambda+\Delta\lambda)^2]/[2m(\lambda+\Delta\lambda)]$--.

COLUMN 22:

Line 2, "$\tan\theta1(\lambda2)$" should read --$\tan\theta1(\lambda1)]$--;

Line 23, "means 17." should read --means 117.--;

Line 24, "no" should read --so--;

Line 28, "first FZP 135" should read --first FZP 134--;

Line 32, "$f_{s1} \div f_{s2}=30.0$ mm," should read --$f_{s1} \doteq f_{s2}=30.0$ mm,--;

Line 36, "first PZP 134," should read --first FZP 134,--;

Line 60, "magnitude $\Delta\delta$" should read --magnitude $\Delta\delta'$--.

COLUMN 23:

Line 12, "magnitude $\Delta\epsilon'$" should read --magnitude $\Delta\delta'$--;

Line 13, "magnitude $\Delta\epsilon'$" should read --magnitude $\Delta\delta'$--;

Line 28, "displacement $\delta'$" should read --displacement $\Delta\delta'$--;

UNITED STATES PATENT AND TRADEMARK OFFICE
CERTIFICATE OF CORRECTION

PATENT NO. : 5,114,236         Page 6 of 8
DATED      : May 19, 1992
INVENTOR(S): Matsugu et al.

It is certified that error appears in the above-identified patent and that said Letters Patent is hereby corrected as shown below:

Line 30, "value $\delta\sigma'$," should read --value $\Delta\delta'$,--; and "quantity $\delta\sigma$" should read --quantity $\Delta\sigma$--;

Line 34, "carried" should read --carries--;

Line 39, "$\delta\sigma$" should read --$\Delta\delta'$--;

Line 46, "carried" should read --carries--;

Line 51, "into" should read --to--;

Line 56, "the" (second occurrence) should read --a--;

Line 57, "center of" should be deleted; and "a gravity" should read --the center of gravity--.

COLUMN 25:

Line 17, "to" (second occurrence) should be deleted;

Line 49, "this occasion" should read --this case--.

COLUMN 26:

Line 48, "photodetector In" should read --photodetector. In--;

Line 49, "occasion," should read --case,--.

COLUMN 28:

Line 16, "projection to" should read --projected in--.

UNITED STATES PATENT AND TRADEMARK OFFICE
CERTIFICATE OF CORRECTION

PATENT NO. : 5,114,236
DATED : May 19, 1992
INVENTOR(S) : Matsugu et al.

It is certified that error appears in the above-identified patent and that said Letters Patent is hereby corrected as shown below:

COLUMN 29:

Line 7, "first mentioned" should read --first-mentioned--;

Line 28, "claim 36," should read --claim 34,--;

Line 53, "claim 39," should read --claim 37,--.

COLUMN 30:

Line 16, "of" should read --for--;

Line 19, "second means" should read --second beams--;

Line 65, "wafer;" should read --wafer.--.

COLUMN 31:

Line 9, "pattern" should read --patterns--;

Line 17, "matrix" should read --mark--.

UNITED STATES PATENT AND TRADEMARK OFFICE
CERTIFICATE OF CORRECTION

PATENT NO. : 5,114,236

DATED : May 19, 1992

INVENTOR(S) : Matsugu et al

It is certified that error appears in the above-indentified patent and that said Letters Patent is hereby corrected as shown below:

COLUMN 32:

Line 11, "pattern" should read --patterns--.

Signed and Sealed this

Twenty-first Day of December, 1993

Attest:

BRUCE LEHMAN

Attesting Officer     Commissioner of Patents and Trademarks